(12) United States Patent
Yilmaz et al.

(10) Patent No.: US 8,390,058 B2
(45) Date of Patent: Mar. 5, 2013

(54) CONFIGURATIONS AND METHODS FOR MANUFACTURING DEVICES WITH TRENCH-OXIDE-NANO-TUBE SUPER-JUNCTIONS

(75) Inventors: Hamza Yilmaz, Saratoga, CA (US); Madhur Bobde, San Jose, CA (US); Yeeheng Lee, San Jose, CA (US); Lingpeng Guan, Sunnyvale, CA (US); Xiaobin Wang, Santa Clara, CA (US); John Chen, Palo Alto, CA (US); Anup Bhalla, Santa Clara, CA (US)

(73) Assignee: Aplha and Omega Semiconductor Incorporated, Sunnyvale, CA (US)

( * ) Notice: Subject to any disclaimer, the term of this patent is extended or adjusted under 35 U.S.C. 154(b) by 280 days.

(21) Appl. No.: 12/661,004

(22) Filed: Mar. 5, 2010

(65) Prior Publication Data
US 2010/0314682 A1     Dec. 16, 2010

Related U.S. Application Data

(63) Continuation-in-part of application No. 12/484,166, filed on Jun. 12, 2009, now Pat. No. 7,910,486, and a continuation-in-part of application No. 12/484,170, filed on Jun. 12, 2009, now Pat. No. 8,299,484.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl. ............. 257/328; 257/E21.41; 257/E21.56; 257/E29.262

(58) Field of Classification Search ................. 257/328, 257/E21.41, E21.56, E29.262
See application file for complete search history.

(56) References Cited

U.S. PATENT DOCUMENTS

| 7,026,248 B2 * | 4/2006 | Yamauchi et al. ............. 438/706 |
| 7,029,977 B2 * | 4/2006 | Kishimoto et al. ............ 438/269 |
| 7,176,524 B2 * | 2/2007 | Loechelt et al. .............. 257/341 |
| 2011/0001189 A1 * | 1/2011 | Challa et al. .................. 257/341 |

* cited by examiner

*Primary Examiner* — David S Blum
(74) *Attorney, Agent, or Firm* — Bo-In Lin

(57) ABSTRACT

This invention discloses semiconductor power device disposed on a semiconductor substrate of a first conductivity type. The semiconductor substrate supports an epitaxial layer of a second conductivity type thereon wherein the semiconductor power device is supported on a super-junction structure. The super-junction structure comprises a plurality of trenches opened from a top surface in the epitaxial layer; wherein each of the trenches having trench sidewalls covered with a first epitaxial layer of the first conductivity type to counter charge the epitaxial layer of the second conductivity type. A second epitaxial layer may be grown over the first epitaxial layer. Each of the trenches is filled with a non-doped dielectric material in a remaining trench gap space. Each of the trench sidewalls is opened with a tilted angle to form converging U-shaped trenches.

20 Claims, 45 Drawing Sheets

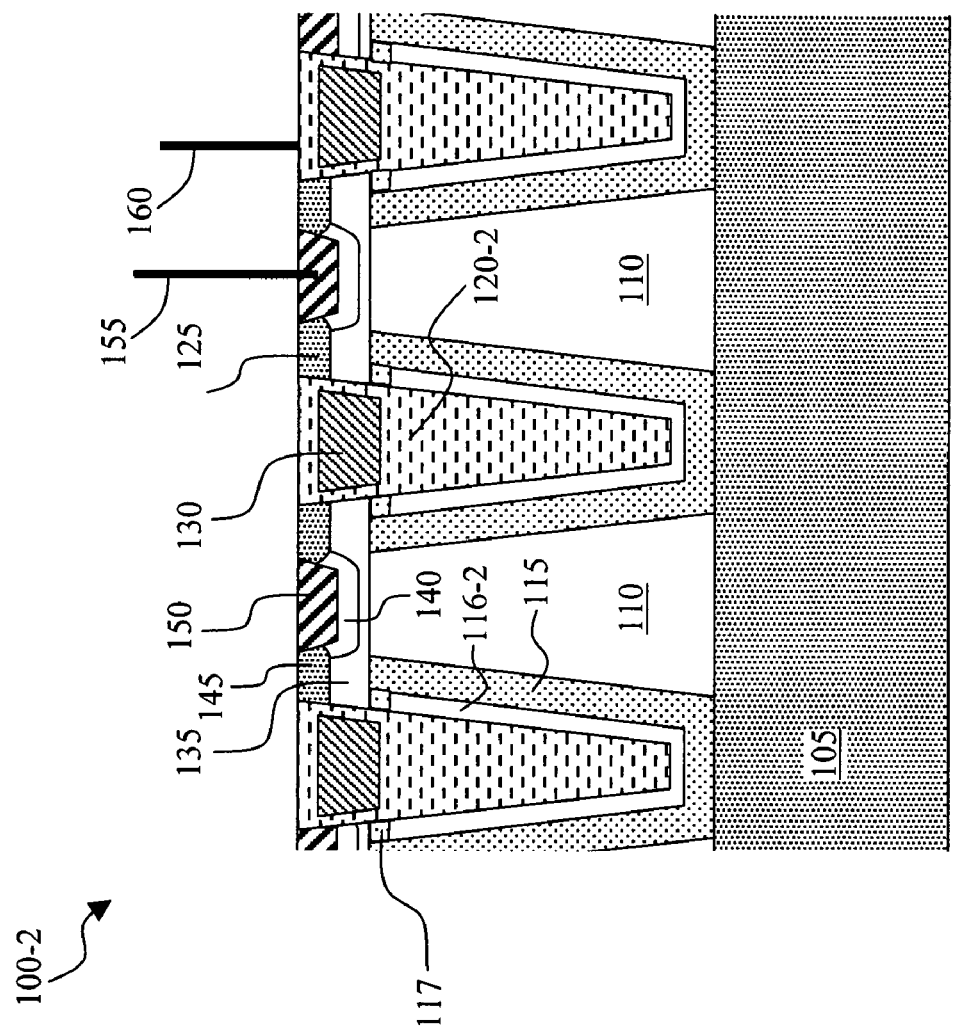

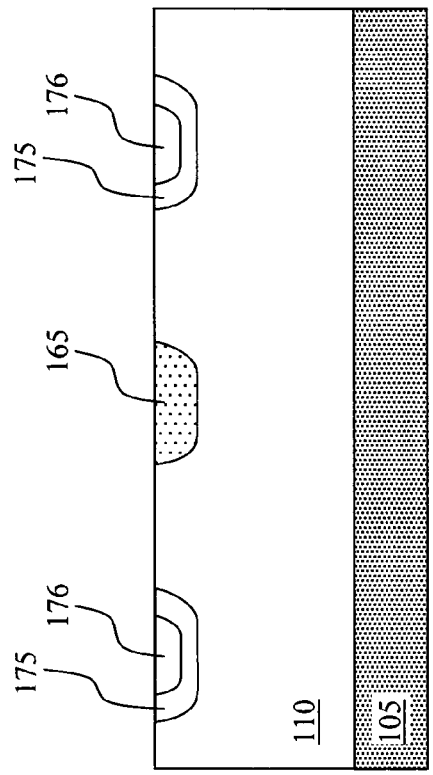
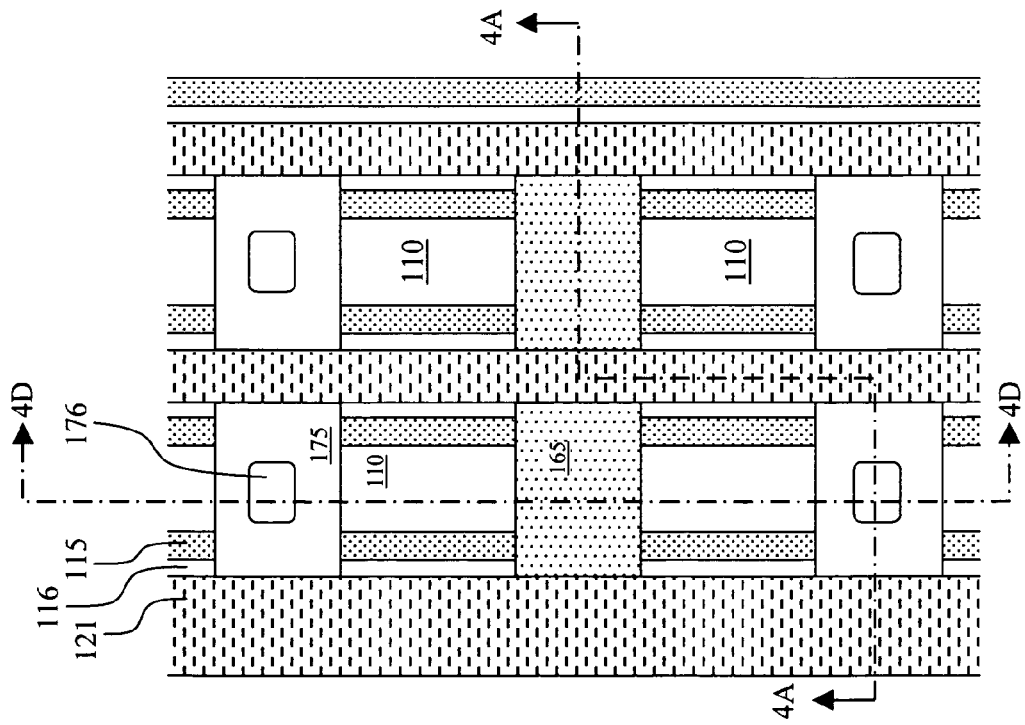

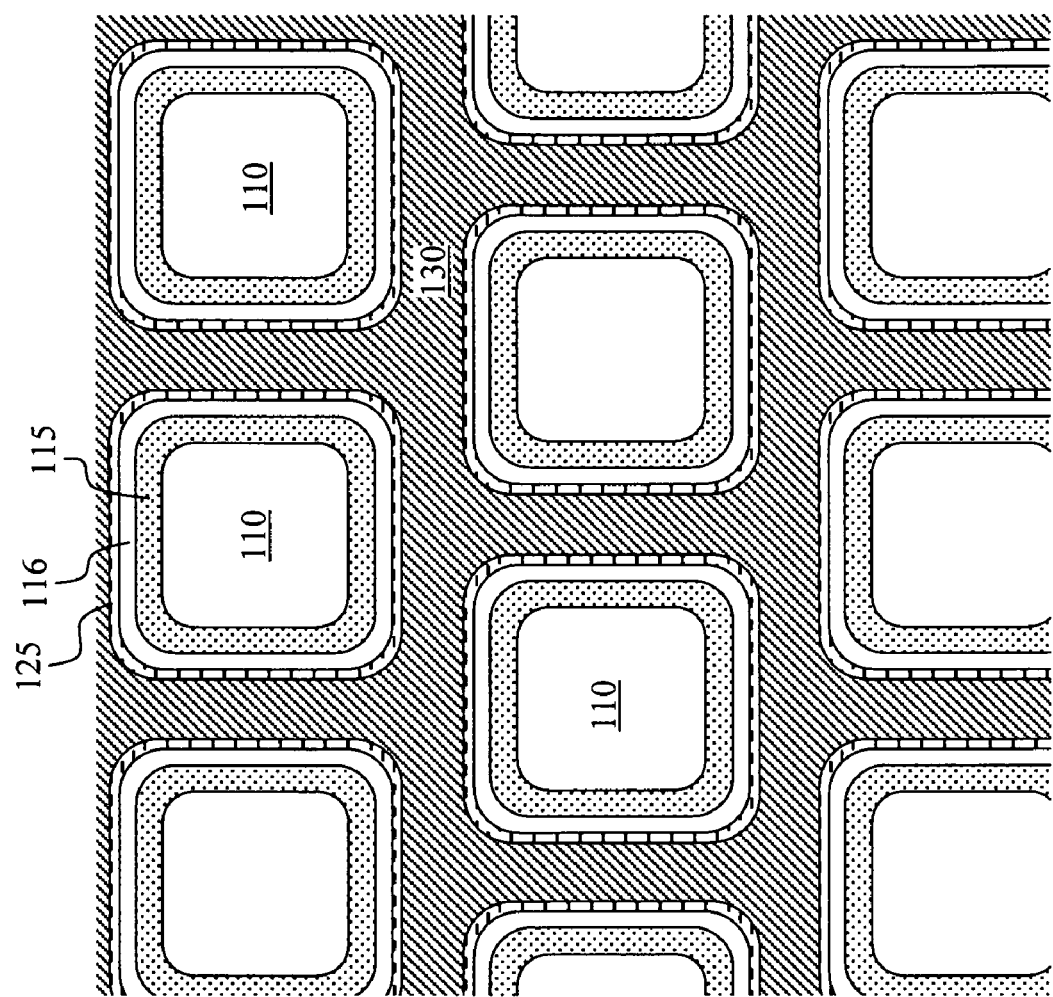

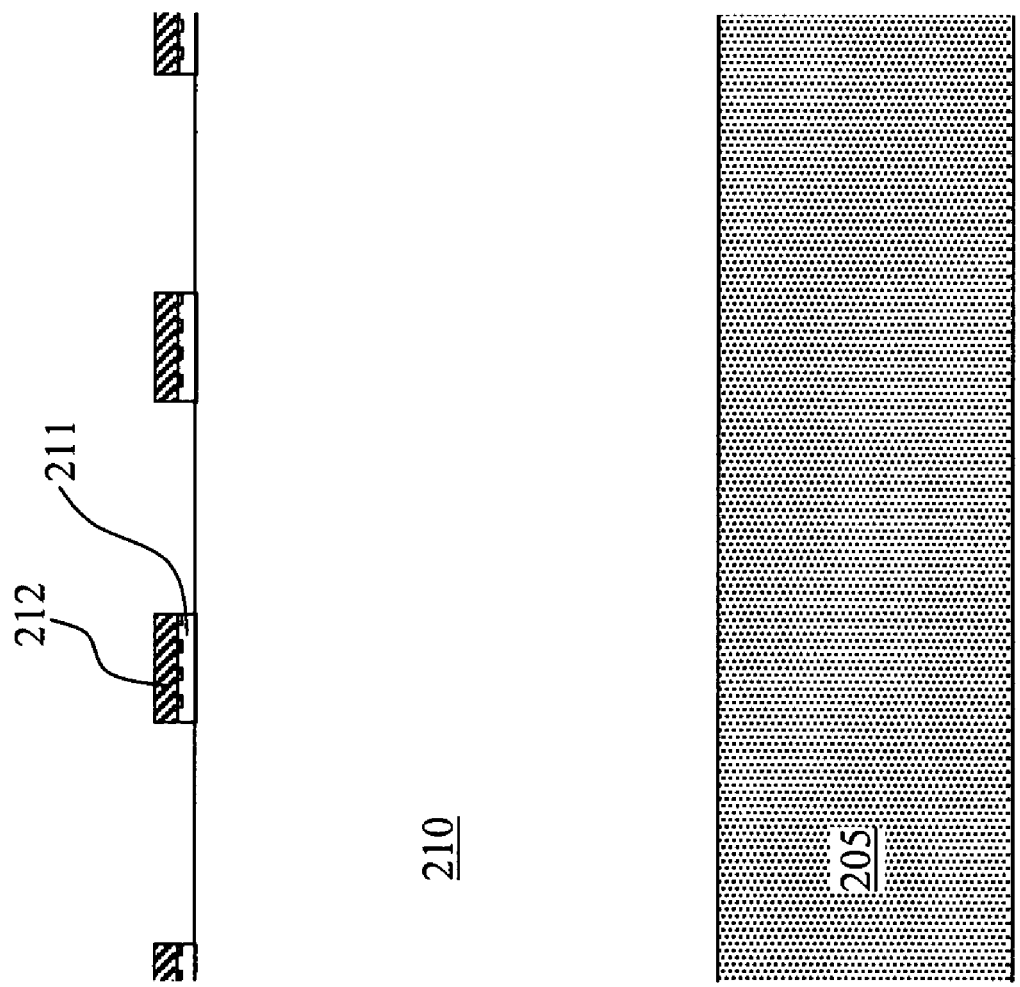

CONFIGURATIONS AND METHODS FOR MANUFACTURING DEVICES WITH TRENCH-OXIDE-NANO-TUBE SUPER-JUNCTIONS

This application is a Continuation-in-Part (CIP) of U.S. application Ser. No. 12/484,166, now U.S. Pat. No. 7,910,486, and Ser. No. 12/484,170, now U.S. Pat. No. 8,299,494, both filed Jun. 12, 2009 and the disclosures made in these two applications are hereby incorporated by reference.

BACKGROUND OF THE INVENTION

1. Field of the Invention

The invention relates generally to the semiconductor power devices. More particularly, this invention relates to configurations and methods implemented with trench nanotubes with trench sidewalls covered with doped epitaxial layer and then filled with insulative material for manufacturing flexibly scalable charge balanced semiconductor power devices with simplified manufacturing processes and achieving improved breakdown voltage and significantly reduced resistance.

2. Description of the Prior Art

Even though there have been many patented disclosures and published technical papers related to semiconductor devices with vertical super junction structure to achieve improved electrical characteristics, those who are involved in the fields of designing and manufacturing the super-junction semiconductor devices are still confronted with technical difficulties and manufacturability limitations. Specifically, the most common super junction devices include the metal oxide semiconductor field effect transistor (MOSFET) and insulated gate bipolar transistor devices and many patented disclosures are published for these devices including U.S. Pat. Nos. 5,438,215, 5,216,275, 4,754,310, 6,828,631. Fujihira further discloses configurations of the vertical super junction devices in the publication "Theory of Semiconductor Super Junction Devices" (Japan Journal of Applied Physics Vol. 36, October 1997 PP 6254-6262). Specifically, FIG. 2A in Fujihira's paper shows a vertical trench MOSFET super junction device published by Fujihira, shown here as FIG. 1A. Fujihira also discloses in U.S. Pat. No. 6,097,063 a vertical semiconductor device having a drift region in which a drift current flows if it is in the ON mode and which is depleted if it is in the OFF mode. The drift region is formed as a structure having a plurality of first conductive type divided drift regions and a plurality of second conductive type compartment regions in which each of the compartment regions is positioned among the adjacent drift regions in parallel to make p-n junctions, respectively. U.S. Pat. No. 6,608,350 discloses a vertical super junction device implemented with layers of a dielectric material to fill in the trenches and U.S. Pat. No. 5,981,996 discloses a vertical trench MISFET device as that shown in FIG. 1B.

However, the configurations and operational characteristics of the super junction devices as disclosed in these patented and published disclosures still encounter technical limitations thus restricting the practical usefulness of these devices. The difficulties and limitations of the conventional super junction devices include the problems and technical issues involved in filling the deep trenches, the size limitation of the nano tubes formed in the trenches, the preservation of charge balance at the mesa areas adjacent to the termination area, poor unclamped inductive switching (UIS) capability of the super-junction devices, oscillation issue of the super junction power devices, high production cost of super junction devices due to slow epitaxial growth rate, inter-diffusions of the N and P impurities in the superjunction structure at high temperatures, difficulties of integrating different devices on a same chip, and large termination area for high voltage applications.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved device structure and manufacturing method by growing a thin N type doped epitaxial layer, e.g., an arsenic epitaxial layer, on sidewalls and bottom of the trenches not completely filling or partially filling the trenches and then growing a second epi layer on top of the first epi layer, then filling the rest of the trench gap with a non-doped dielectric material thus resolving the problems and technical issues related to filling the deep trenches with epitaxial layer often encountered in conventional methods of manufacturing. The second epi layer may substantially fill the bottom portion of the remaining trench gap, thus making it easier to deposit dielectric material into the gap.

Another aspect of the present invention is to provide a new and improved device structure and manufacturing method with a super junction structure applying charge balance principle with a nano-tube configuration to reduce the Rds and small cell pitch to achieve a 6 microns pitch 600V MOSFET that has less than 9 milliohms-cm^2 specific on resistance. The limitations of high Rds for high voltage devices are therefore resolved.

Another aspect of the present invention is to provide a new and improved device structure and manufacturing method with a super junction structure that preserves charge balance at the end of the active area mesas by using larger pitch and narrow N-epitaxial layer and using single cell with larger radius at the end of each active cell finger.

Another aspect of the present invention is to provide a new and improved device structure and manufacturing method with a super junction structure that configures the super junction structure in an epitaxial layer formed with graded dopant concentrations, e.g., P epitaxial layer formed with three steps on an N+ substrate, to force the breakdown into a lower portion of the drift region thus improving the UIS capability of the superjunction MOSFET devices.

Another aspect of the present invention is to provide a new and improved device structure and manufacturing method with a super junction structure configured with a thick dielectric region beneath the gate electrode to lower the gate-drain capacitance Crss thus resolving the oscillations issue of the super junction power devices.

Another aspect of the present invention is to provide a new and improved device structure and manufacturing method with a super junction structure by growing a thin single layer N− epitaxial layer (0.1-1.0 micron thickness range) partially filling the trenches, and filling the rest of the deep trenches with dielectric/oxide thus resolving the problems of high production cost of the superjunction devices due to slow epitaxial growth in the deep trenches. Additionally, a lowly doped N type epitaxial layer may be grown after the N-epi, substantially filling the trench, before filling the rest of the deep trenches with dielectric/oxide, which may make it easier to fill the trench with oxide.

Another aspect of the present invention is to provide a new and improved device structure and manufacturing method with a super junction structure by forming a very thin N-type Nano-Tube layer next to and charge balanced with a wider P-type region; by way of example, having a 3 times wider P-type region results in 3 times lower Boron doping concentration than N-type doping concentration in the N-type Nano-Tube region. Thus only limited Boron diffusion is allowed into the N type Nano-Tube region which can be compensated with extra Arsenic charge. Heavy N type dopants such as Arsenic or Antimony for the N-type Nano-Tube region do not move much and so will not diffuse significantly into the P-type region. Therefore, the problems caused by inter diffusion of N and P impurities at high temperature are resolved.

Another aspect of the present invention is to provide a new and improved device structure and manufacturing method with a super junction structure by increasing the width of the trench region at the boundary of a first device, for example a MOSFET device and a second device such as a Schottky diode, with the large trench region substantially filled with dielectric material—as opposed to active cells which are substantially filled with silicon and the rest with silicon oxide (oxide, or SiO2). Different devices can therefore be more conveniently integrated on a same silicon chip.

Another aspect of the present invention is to provide a new and improved device structure and manufacturing method with a super junction structure by integrating a Schottky diode with a controlled injection P-N diode thus providing reduced diode recovery charge with reduced leakage currents for high voltage devices.

Another aspect of the present invention is to provide a new and improved device structure and manufacturing method with a super junction structure by integrating a high voltage (HV) Schottky diode with controlled injection P-N junction diode integrated on the same silicon die as an insulated gate bipolar transistor (IGBT) wherein the backside of the IGBT is provided with implantation of emitter (P-type for N-channel device). Therefore, the difficulties of lacking a built-in diode for an IGBT structure are resolved.

Another aspect of the present invention is to provide a new and improved termination structure by a method of making a wide dielectric trench by first forming an SiO2 network, then etching away the silicon mesas within the SiO2 network and filling the newly etched away regions with spin on type glass, HDP or polyimide before or after metallization depending on the type dielectric material chosen. Due to manufacturing restraints, a wide and deep dielectric trench is difficult to manufacture in a conventional etch and fill method, but the two step method of this invention can form a high quality deep and wide dielectric filled trench using standard manufacturing steps. A normally 6-10 mils wide HV termination region can be reduced down to 2 mils for each side of a 600V device using this wide oxide trench for a termination region. For low current products this HV termination region increases die size from ~15% for large dies (in a TO-220 fill the capacity) to 50% for a smaller die (53×53 mils^2 die with 8 mils per side for HV termination). Therefore, the difficulties of requiring a large termination area for a high voltage MOSFET power device can be resolved because the termination area is reduced for devices appropriate for high voltage applications.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2A-2C are cross sectional views of MOSFET devices implemented with alternate trench nano-tube super junction structures of this invention.

FIG. 4C is a top view and FIG. 4D is another cross section view of the structure of FIG. 4A.

FIGS. 8A and 8B are top views for showing a closed cell configuration of the power devices of this invention.

FIGS. 10A to 10I are a series of cross sectional views for showing the manufacturing processes of the MOSFET device of FIG. 2.

DETAILED DESCRIPTION OF THE METHOD

Figure 1A:
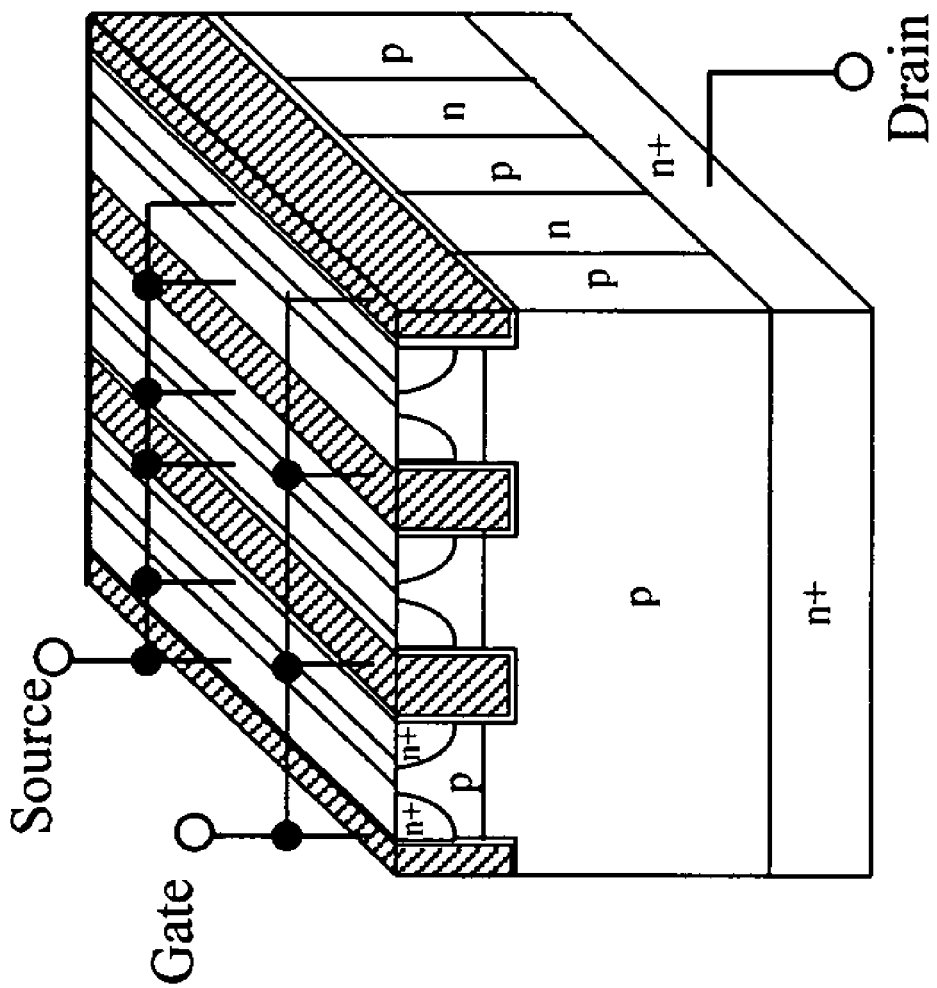
FIG. 1A is a cross sectional perspective view for showing a conventional configuration of a vertical super junction power device.
Figure 1B:
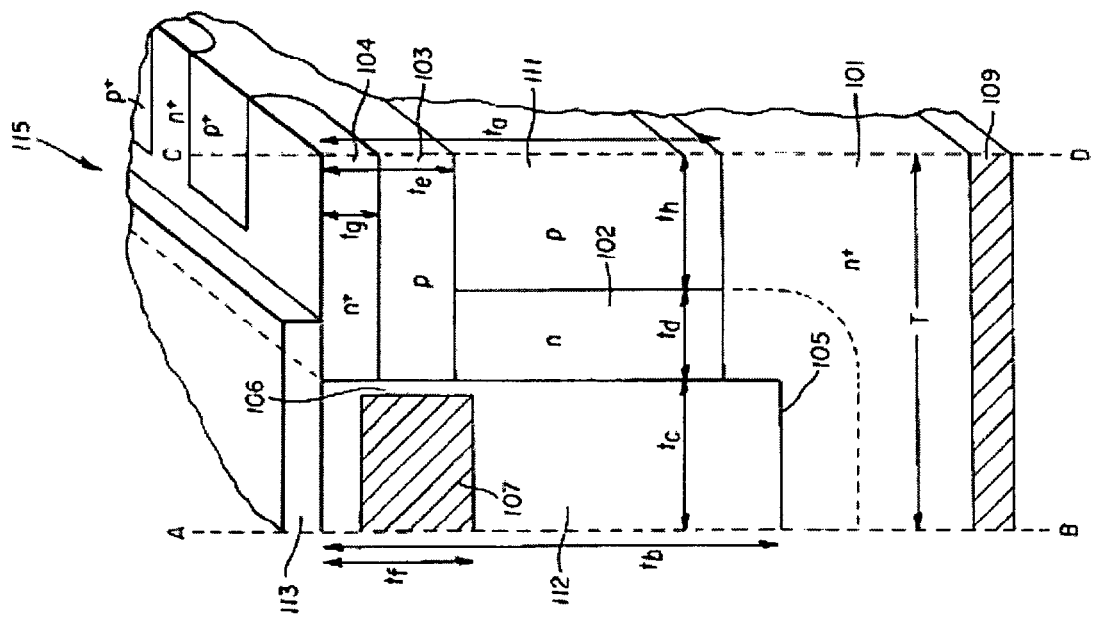
FIG. 1B is a cross sectional view for showing a conventional configuration of a vertical super junction power device.
Figure 2:
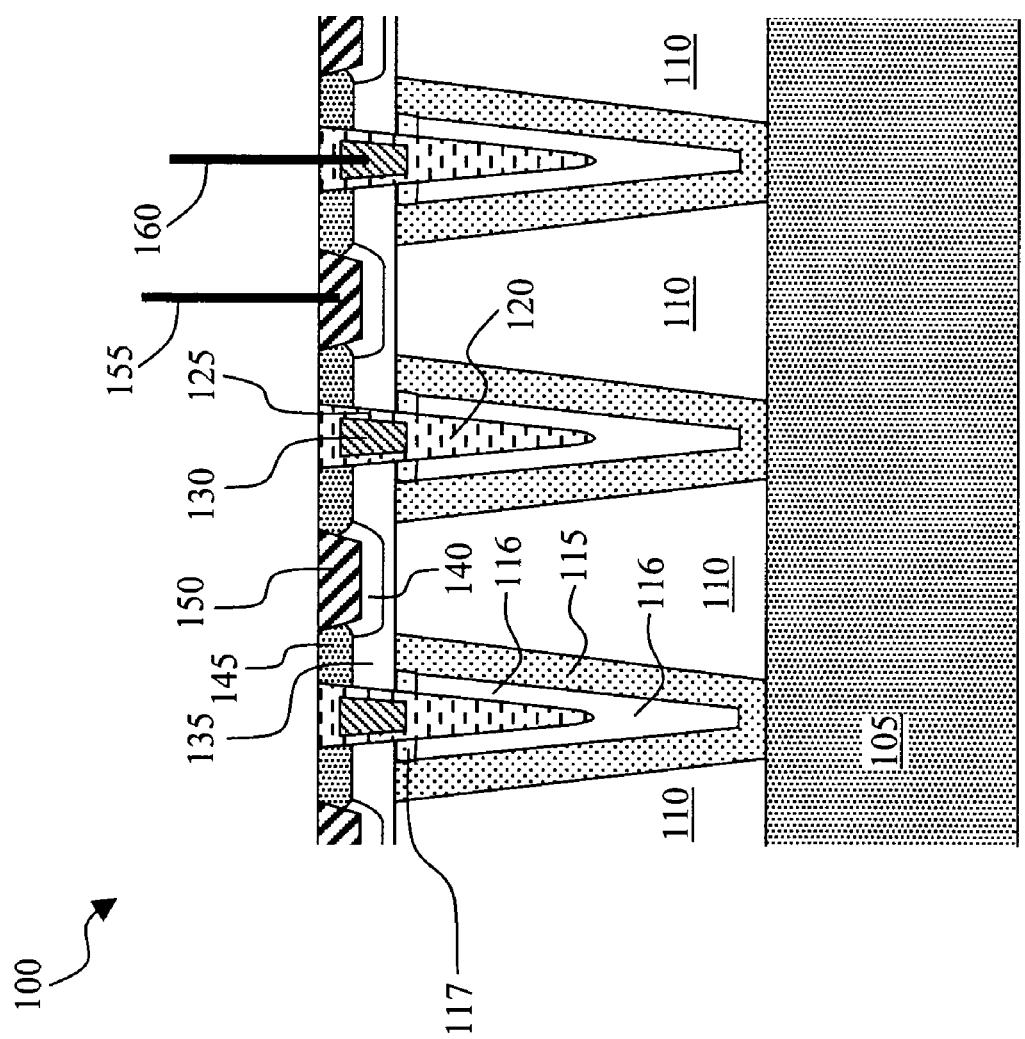
FIG. 2 is cross sectional view of a MOSFET device implemented with a trench nano-tube super junction structure of this invention.

FIG. 2 shows a cross sectional view of a trench nano-tube metal oxide semiconductor field effect transistor (MOSFET) device 100 of this invention. The MOSFET cells are formed in a P-type epitaxial layer 110 supported on an N+ substrate 105. A plurality of trenches are opened in the epitaxial layer 110 configured as nano tubes with trench sidewalls covered with N+ epitaxial layer 115. The trenches are formed with sidewalls having a slightly tilted angle to form a tapered trench. By way of example the walls may be slightly tilted at 87-89 degrees with each of the trench sidewalls is covered with the N+ epitaxial layer 115. An additional lowly doped P– epitaxial layer 116 is grown over the N+ epitaxial layer 115. Because of the remaining trench width and the tilted angle of the trench, the sidewalls of the P– epitaxial layer 116 converge towards the bottom and substantially fill the bottom portion of the trench. The remaining central portion of the trenches is filled with a dielectric such as silicon oxide 120. The MOSFET device 100 further includes trench gates 130 formed on the top portion of the trenches and padded and surrounded with a gate oxide layer 125 and also insulated below by the silicon oxide layer 120 from the N+ sidewall layers 115. The MOSFET device 100 further includes body regions surrounding the trench gates 130. Each body region includes a P-body region 135 and a heavily doped P+ body contact region 140. The MOSFET device 100 further includes N+ source regions 145 disposed near the top surface of the MOSFET device 100 and encompassed in the P body regions 140 and 135. The MOSFET device 100 further includes a barrier metal layer 150 to contact the source regions 145 and the P+ body contact region 140 and can also be connected to the source electrode 155. A gate electrode 160 is also formed for applying a gate voltage to the trench gates 130. When the MOSFET device 100 is turned on, a channel (not shown) is formed in the body region 135 adjacent to the trench gate 130.

The P-epitaxial layer 110 and the trenches formed with the sidewalls covered by N epitaxial layer 115 and lowly doped N-- epi layer 116 constitute nano tube structure to achieve a charge balance for the MOSFET device. This invention presents a charge balanced high voltage device which is also conducive to efficient manufacturing. The N sidewall layers 115, i.e. nano tube, are charge balanced with the adjacent portions of P epitaxial layer 110 such that the N sidewall layer 115 forms a drift region for the MOSFET which depletes in the OFF mode. The P- epitaxial layer 116 may further comprise an N-type implant region 117 under the body region 135 to connect the channel to the drift region in N sidewall layer 115. The P- epitaxial layer 116 can provide further charge balancing and improve the Rdson by depleting the N epitaxial layer from another side and allowing a higher charge to be stored in the N epitaxial layer 115. For example, if 25% more P-type charges are stored in the P- epitaxial layer 116, 25% more N-type charges can be stored in the N epitaxial layer 115, resulting in a 25% reduction in Rdson. The P- sidewall layers 116 also substantially fill the bottom portions of the deep trenches. This leaves remaining gaps in the trenches with a lower aspect ratio can be easily filled with oxide fill 120 without manufacturing issues such as void formation. The oxide fill 120 insulates the trench gate 130 from the drain potential, and reduces the gate-drain capacitance.

By way of example and not by way of limitation, the N-epitaxial layer 115 may be about 1 micron wide, the P epitaxial layer 110 between adjacent N-epitaxial layers 115 may be about 6 microns wide. The P epitaxial layer 110 can be thought of as having two halves, each half having a width of 3 microns and charge balancing with the N epitaxial layer 115. The portions of the N epitaxial layer 115 and the P epitaxial layer 110 that are charge balancing have a charge concentration of approximately $1E12$ $cm^{-2}$, so that the doping concentrations are $3.33E15$ $cm^{-3}$ for the P epitaxial layer 110 and $1E16$ $cm^{-3}$ for the N epitaxial layer 115. With the addition of a 1 micron wide P epitaxial layer 116 having a charge concentration of $0.25E12$ $cm^{-2}$ and a doping concentration of $2.5E15$ $cm^{-3}$, the doping concentration of the N epitaxial layer 115 can be raised to $1.25E16$ $cm^{-3}$ thus lowering the Rdson.

Figure 2A:
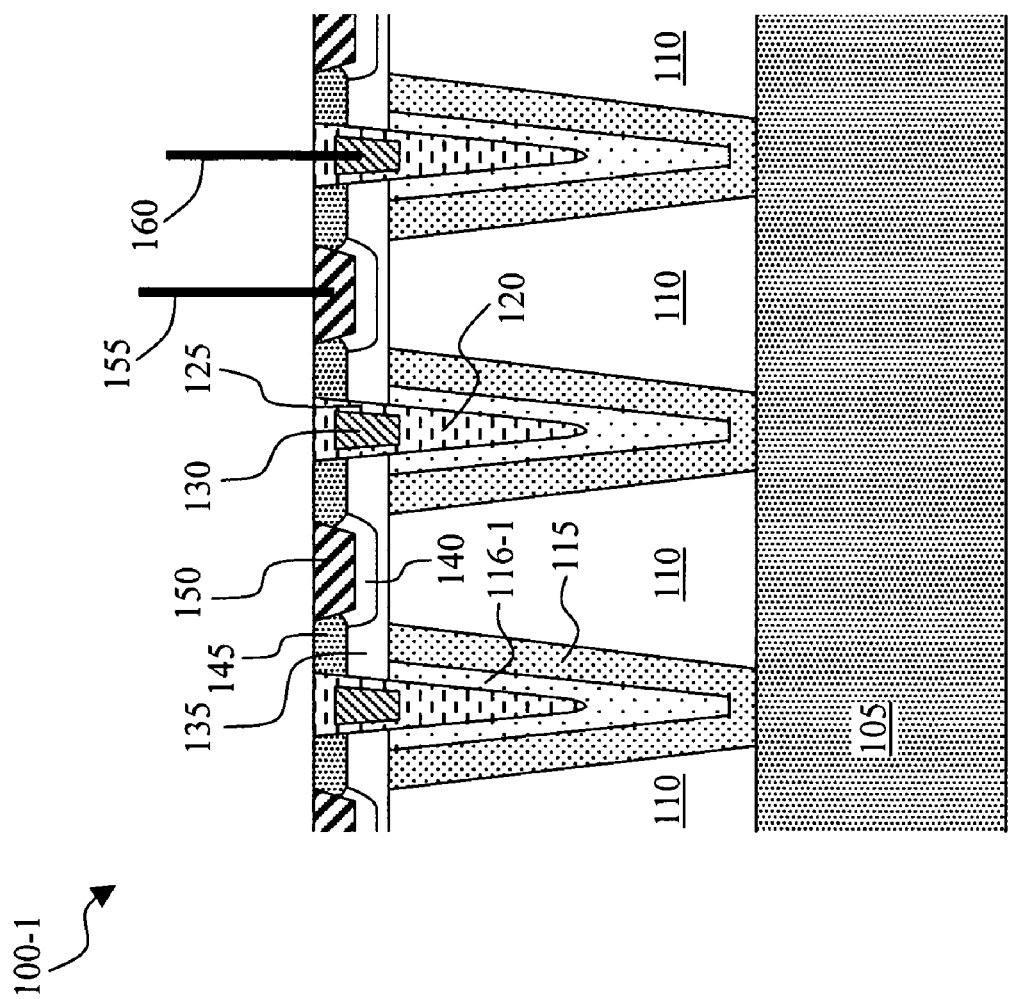

FIG. 2A shows an alternative embodiment of a trench nano-tube (MOSFET) device 100-1 of this invention. MOSFET device 100-1 is similar to MOSFET device 100 of FIG. 2, except that a lowly doped N-- epitaxial layer 116-1 (rather than the P- epitaxial layer 116 of FIG. 2) is grown on the N+ epitaxial layer 115. Accordingly, the N-type implant region 117 is not needed in MOSFET device 100-1. The lowly doped N-- epitaxial layer 116-1 also substantially fills a lower portion of the trench, facilitating the subsequent forming of the oxide fill 120. The use of a N-- epitaxial layer 116-1 is easier to manufacture than the P epitaxial layer 116 because the same epitaxial growth chamber can be used after forming the N epitaxial layer 115, whereas the growing the P epitaxial layer 116 would require moving the wafer to another growth chamber. This improves the throughput of the device. In an alternative embodiment, the N epitaxial layer 116-1 may be replaced with an intrinsic, or a lowly doped P-- layer.

FIG. 2B shows an alternative embodiment of a trench nano-tube (MOSFET) device 100-2 of this invention. MOSFET device 100-2 is similar to MOSFET device 100 of FIG. 2, except that the trenches are wider such that the P epitaxial layer 116-2 formed over the N+ epitaxial layer 115 only lines the trench and does not substantially fill the bottom portion of the trench. Instead, oxide fill 120-2 fills most of the bottom portion of the trench.

Figure 2C:
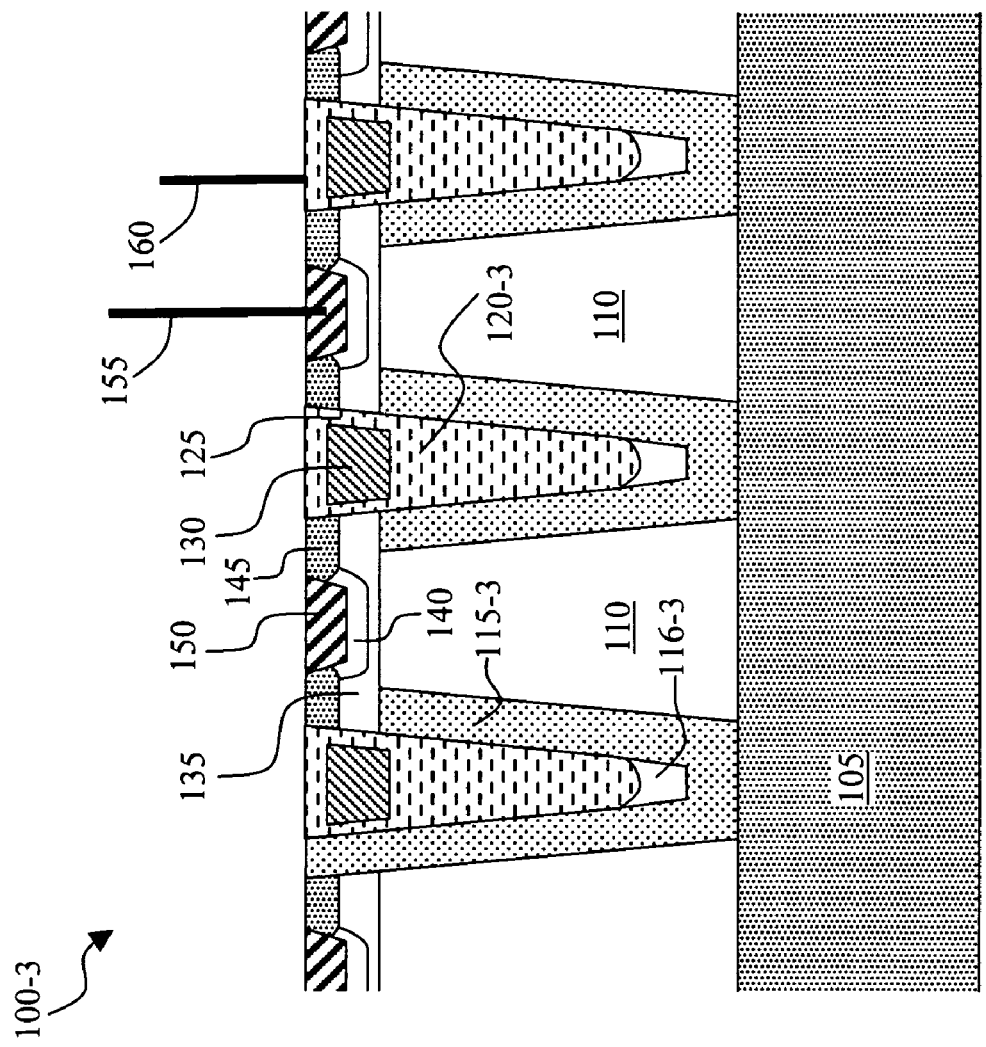

FIG. 2C shows an alternative embodiment of a trench nano-tube (MOSFET) device 100-3 of this invention. MOSFET device 100-3 is similar to MOSFET device 100 of FIG. 2, except that the P epitaxial layer 116-3, is thin enough that the N+ epitaxial layer 115-3 counterdopes it in most areas except at the bottom under the oxide fill 120-3 where the P epitaxial layer 116-3 is thicker. Alternatively, this structure may be formed if a light isotropic etch is performed after growing the P epitaxial layer 116-3. The isotropic etch would remove the side portions of the P epitaxial layer 116-3, leaving a bottom portion of the P epitaxial layer 116-3.

Figure 3:
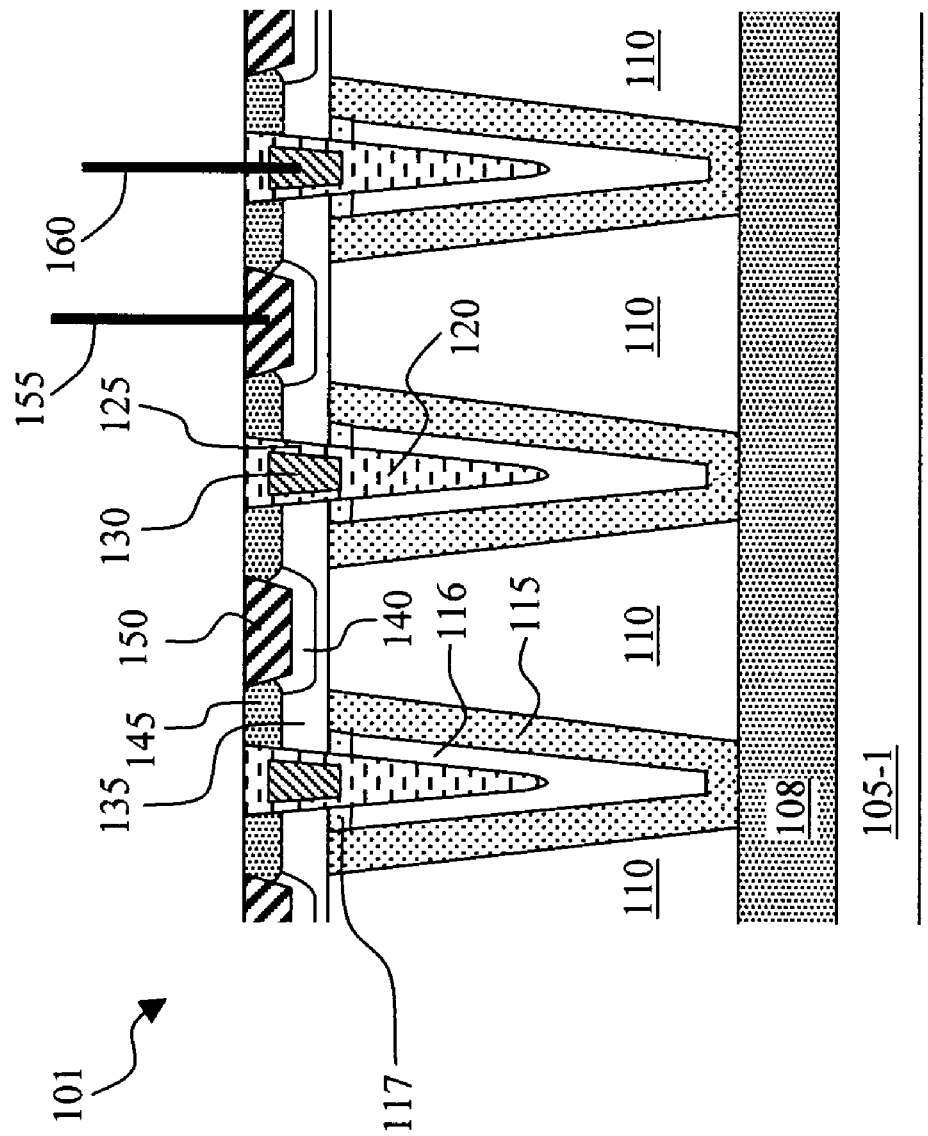
FIG. 3 is a cross sectional view for an N-channel insulated gate bipolar transistor (IGBT) device implemented with a trench nano-tube super junction structure of this invention.

FIG. 3 is a cross sectional view for showing an N-channel insulated gate bipolar transistor (IGBT) device 101 formed with a trench nano-tube structure of this invention. The IGBT device 101 is formed in P-type epitaxial layer 110 supported on a P substrate layer 105-1 functioning as an IGBT collector with an N-channel stop layer 108 disposed between the P-epitaxial layer 110 and the P+ IGBT emitter layer 105-1. Similar to the structure of the MOSFET device shown in FIG. 2, the IGBT device 101 includes a plurality of trench nano tubes formed in the epitaxial layer 110 that include a plurality of trenches. The trenches are formed with sidewalls having a slightly tilted angle and each of the trench sidewalls is covered with an N nano tube layer 115, a P- epitaxial layer 116 and the central portion of the trenches filled with a silicon oxide 120. The IGBT device 101 further includes trench gates 130 formed on the top portion of the trenches and padded and surrounded with a gate oxide layer 125 and also insulated by the silicon oxide layer 120 from the N+ sidewall layers 115. The IGBT device 101 further includes body regions surrounding the trench gates. Each body region includes a P-body region 135 disposed beneath a heavily doped P+ body contact region 140. The IGBT device 101 further includes N+ source regions 145 disposed near the top surface and encompassed in the P body regions 135 and 140. The IGBT device 101 further includes a barrier metal layer 150 to connect the source regions 145 and body region 140 to the emitter electrode 155. A gate electrode 160 is also formed for applying a gate voltage to the trench gates 130.

The P-epitaxial layer 110 and the trenches formed with the sidewalls covered by N epitaxial layer 115 constitute nano tube structures to form a charge balanced drift region for the IGBT device.

Figures 4A, 4B:
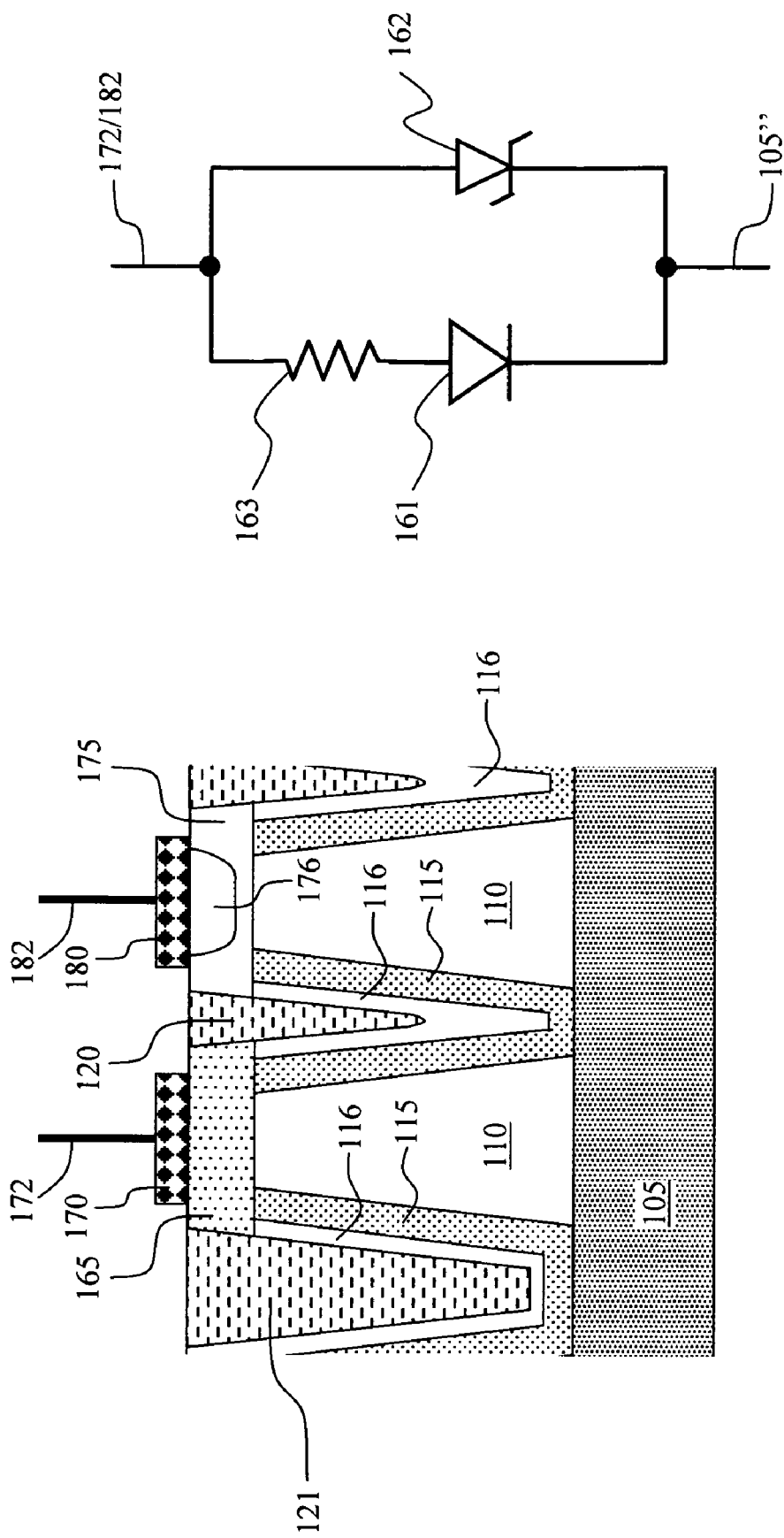
FIG. 4A is a cross sectional view and FIG. 4B is an equivalent circuit diagram of a charge injection control resistor implemented with a trench nano-tube super junction structure of this invention.

FIG. 4A is a cross sectional view for showing a charge injection controlled diode formed with a trench nano-tube structure of this invention. FIG. 4B is a circuit diagram that shows an equivalent circuit of the charge injection control resistor R1 163 with Schottky diode 162 and PN junction diode 161 of FIG. 4A. The charge injection control resistor R1 163 is connected in series with a PN junction diode 161 connected in parallel with a Schottky diode 162. The resistor 163 may be integrated with the device, e.g. as a metal or polysilicon resistor, or may be external to the device, so that a user may choose which resistance value to use. A P-type epitaxial layer 110 is supported on an N/N+ substrate layer 105 functioning as a cathode for the PN junction diode and the Schottky diode. The ohmic contact to the P epitaxial layer 110 is formed in a third dimension to a P+ region 176. The Schottky diode and the PN junction diode are supported on the P epitaxial layer 110 formed with a plurality of trench nano tubes that include a plurality of trenches. The trenches are formed with sidewalls having a slightly tilted angle and each of the trench sidewalls is covered with an N epitaxial layer 115 and P epi layer 116, and the central portion of the trenches is filled with a silicon oxide 120. A wider trench may be formed on with wider and deeper oxide fill 121 than the other oxide fill 120. This can help separate different devices when they are formed on the same semiconductor die. The Schottky diode includes an N-region 165 with a Schottky contact metal 170 covering the top surface of the N region 165. The N region 165 is disposed on top of the nano tube 115 and adjacent to the oxide layer 120, and contacts the P epitaxial layer 110 and the N doped regions 115. The PN junction diode includes a P/P+ region 175/176 with an ohmic contact metal layer 180 functioning as a modulation gate covering the top surface of the P/P+ region 175/176. The P region 175 contacts the P epitaxial layer 110 and the nano tube layer 115. The resistor R1 163 controls the level of injection in the P-N junction diode by reducing the voltage across the PN junction diode (by voltage $V_{R1}=I_{diode}*R1$), thus reducing the amount of stored charge and improving the reverse recovery for the PN junction diode. A larger value of the resistor R1 would result in improved reverse recovery, and less forward conductivity due to decreased conductivity modulation. A smaller value of the resistor R1 would have the opposite effect. Putting a Schottky diode in parallel with the PN junction diode further reduces the amount of stored charges in the PN junction diode. Sizing the resistor R1 163 may thus program the amount of stored charge in the PN junction diode 161 and the performance of the diodes. The PN junction diode reduces the leakage current of the high voltage (HV) Schottky diode and optimize forward voltage drop Vf of the composite device.

As shown in the top view of FIG. 4C, and the cross sectional view of FIG. 4D, the Schottky diode (represented by N region 165) and PN junction diode (represented by P/P+ regions 175/176) are located in the same stripe of epitaxial layer 110.

Figure 5:
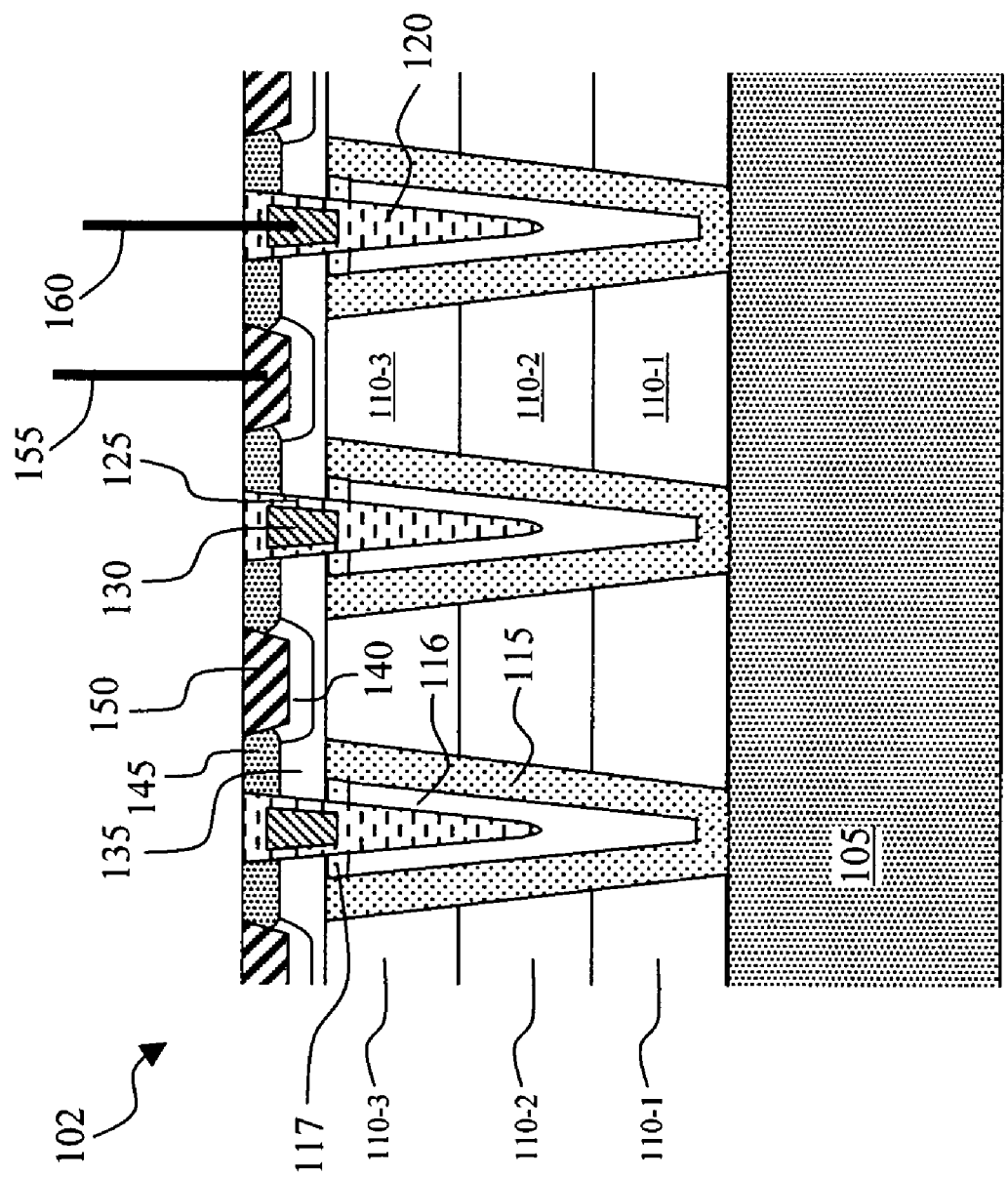
FIG. 5 is a cross sectional view of an alternate embodiment of the MOSFET device of FIG. 2 implemented with a trench nano-tube super junction structure and three epitaxial layers of different dopant concentrations.

FIG. 5 is a side cross sectional view of a MOSFET device 102 with trench nano tube structure similar to the MOSFET device shown in FIG. 2. The P epitaxial layer 110 is formed as a graded epitaxial layer 110' with three P doped layers 110-1, 110-2, and 110-3 formed by three step epitaxial growth with three different dopant concentrations. The epitaxial dopant concentration becomes greater with height, i.e., bottom P doped layer 110-1 has the lowest doping concentration and top P doped layer 110-3 has the heaviest doping concentration. The graded epitaxial layer 110' improves the UIS of the device by shifting the breakdown zone down from the top of the epitaxial layer. Also, putting slightly more charge in the P epitaxial region 110 than in the N regions 115 can improve UIS by shifting breakdown field down in the P epi 110. Although this example is shown with a three step epitaxial layer, more steps can be used for forming the graded epitaxial layer. Alternatively, a single gradually graded epitaxial layer could be used, with the doping concentration gradually decreasing from top to bottom.

Figure 6:
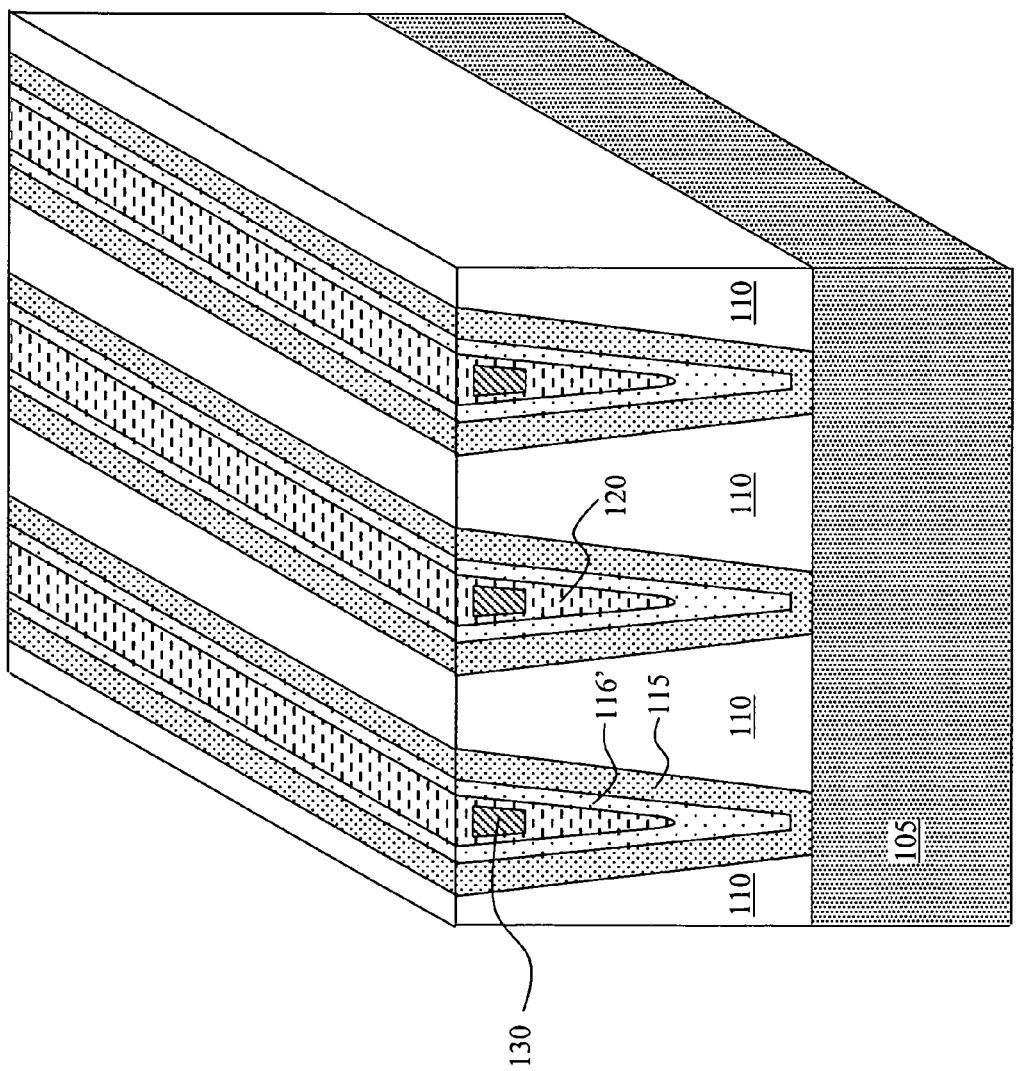
FIGS. 6 and 7 are two partial perspective views of two MOSFET devices implemented with a trench nano-tube super junction structure of this invention.
Figure 7:
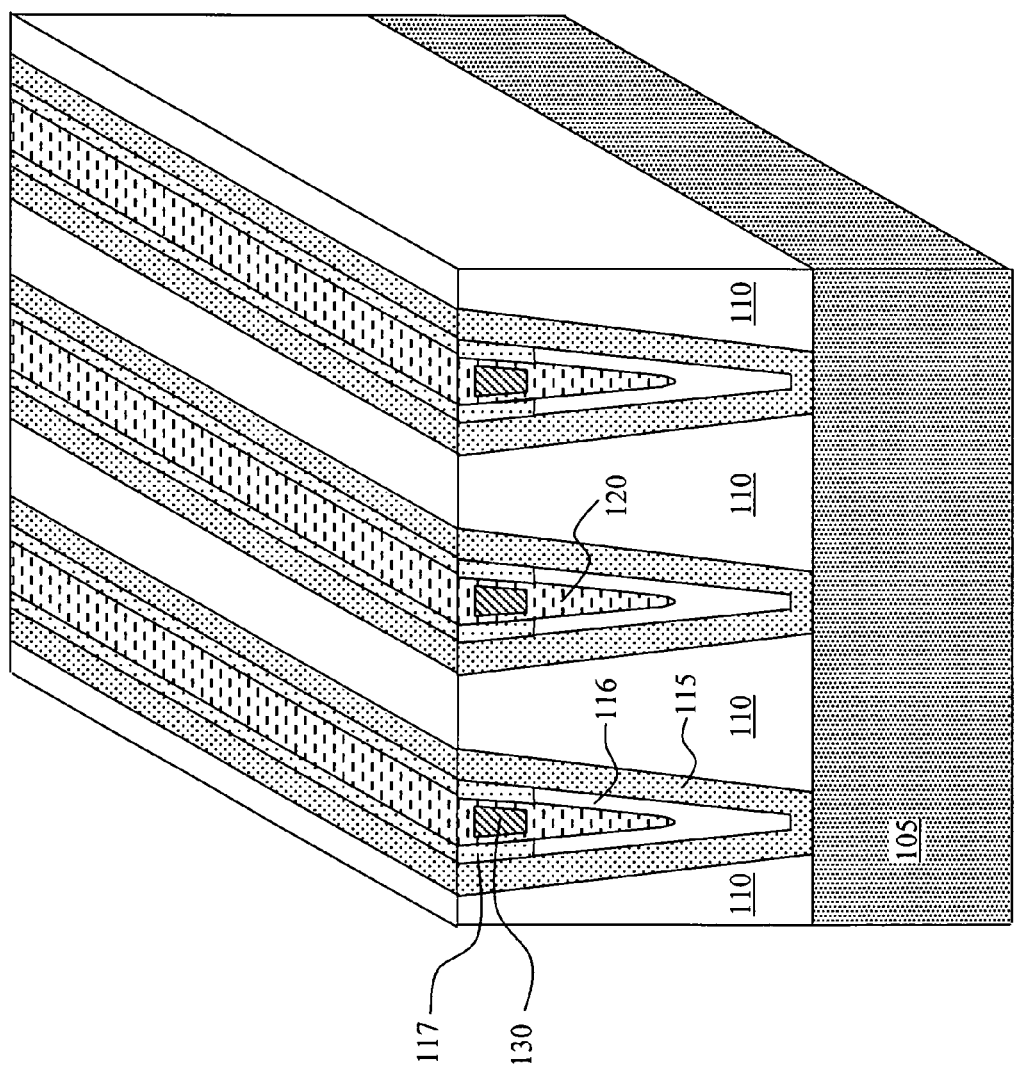
Figure 7A:
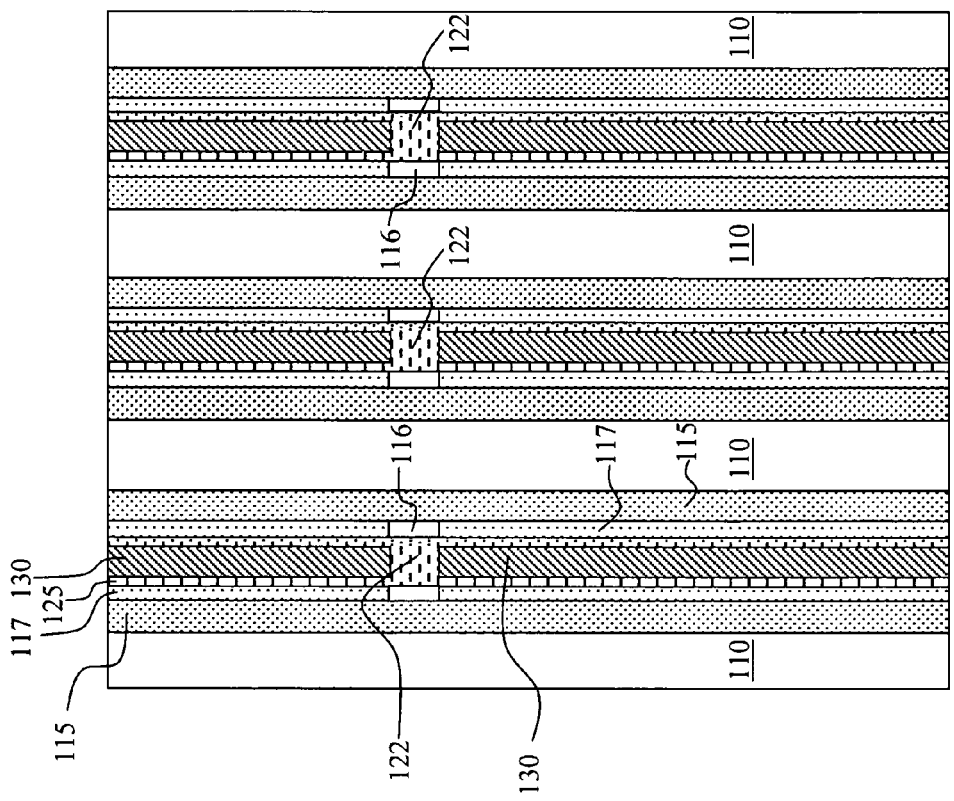
FIG. 7A is a top view of a MOSFET device like that of FIG. 7.

FIGS. 6 and 7 are side perspective views for showing two different devices configured as stripe cells. For illustrative purposes, the source and body regions are not shown here—only the gate and the epitaxial layers are shown. FIG. 6 shows a device similar to device 100-1 of FIG. 2A, and FIG. 7 shows a device similar to device 100 of FIG. 2. FIG. 7A is a top view of the device of FIG. 7 showing discontinuity regions 122 in the gate 130, and adjacent portions of P-epitaxial layer 116. A mask keeps the oxide fill 120 from being etched in the regions 122 during the manufacturing process. The same mask also keeps the P-epitaxial layer 116 adjacent to the discontinuity regions 122 from being implanted with the P-type implants 117 which are present elsewhere along the trenches. In these areas with exposed P-epitaxial layer 116, connection can be made from the source voltage to the P-epitaxial layer 116 for charge balance purposes. Alternatively, instead of forming a discontinuity region 122 in the gate 130, the implant forming the P-type implants 117 may be masked rather than a blanket implant, allowing for a region of P– epitaxial layer 116 to be un-counterdoped and make connection with the source voltage. Alternatively, this same effect may be achieved by masking the P-type implantation step that forms the P-type implants 117 to create regions where the P-epitaxial layer 116 is exposed.

Figure 8B:
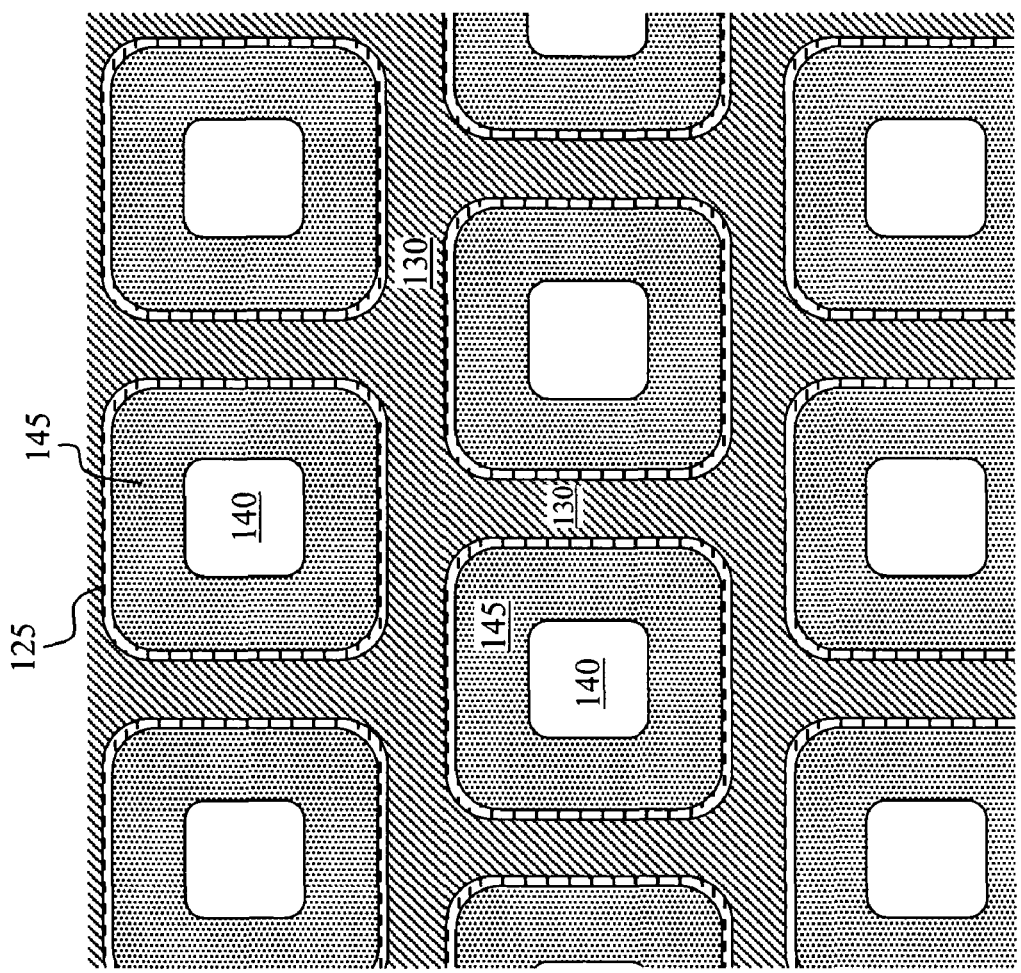

FIGS. 8A and 8B are top views of a MOSFET device configured with closed cells. The closed cell configurations as shown in FIGS. 8A and 8B reduce the Rds resistance by about 30% when compared with a stripe configuration, when in a six-by-six closed cell unit with the silicon mesa of 3 micrometers, i.e., 2.5 micrometers of P-regions and 0.25 micrometers of N-rings and three micrometers trench openings. FIG. 8A shows the closed cell layout of the nano tube structure without the source or body regions. In the center of each closed cell is the P– epitaxial layer 110, which is surrounded by the N– type nano tube 115 and the N-- epitaxial layer 116. The trench gate 130 and gate oxide 125 surrounds the closed cells. In FIG. 8B, the source and body regions are shown, with the P+ body contact 140 in the center of each closed cell, surrounded by the N+ source region 145. For simplicity, the P– implant regions 117 are not shown here. Alternatively, a closed cell configuration with discontinuous gate may be used in which the trench gate and semiconductor positions are switched such that the semiconductor substrate (including source and body) surround the trench gates such that the trench gates are in the center of the closed cells.

Figure 9:
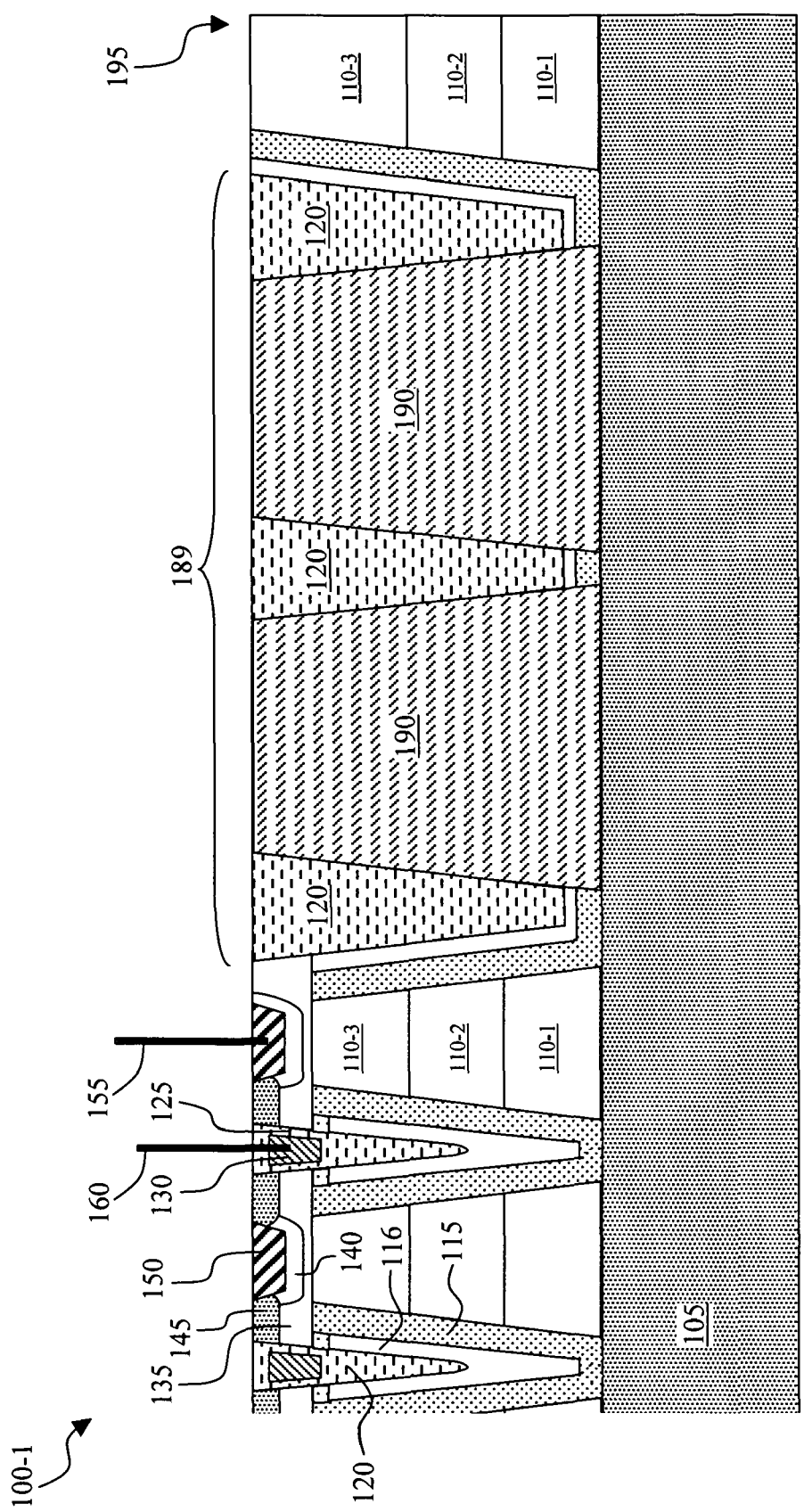
FIG. 9 is a cross sectional view of a MOSFET device implemented with a trench nano-tube super junction structure and specially configured termination area of this invention.

FIG. 9 is a side cross sectional view of a MOSFET device with trench nano tube structure similar to the MOSFET device 102 shown in FIG. 5. The P epitaxial layer 110 is formed as three P doped layers 110-1, 110-2, and 110-3 formed by an epitaxial growth process with three different dopant concentrations decreasing along a top to bottom direction. The MOSFET device further includes a high voltage termination region implemented with a wide and deep termination trench 189, e.g., 30 micrometers, filled with dielectric material 190 and oxides 120. The termination trench 189 is formed with an initial network of trenches filled with oxide 120, which may be formed at the same time as the oxides 120 of the active trenches. Semiconductor mesas (not shown) are left between the network of oxide 120; the semiconductor mesas are then etched away, and a dielectric material 190 is filled in the resulting gaps. The termination area ends with a saw street region 195 disposed on the peripheral edge of the die.

Figures 1, 10B:
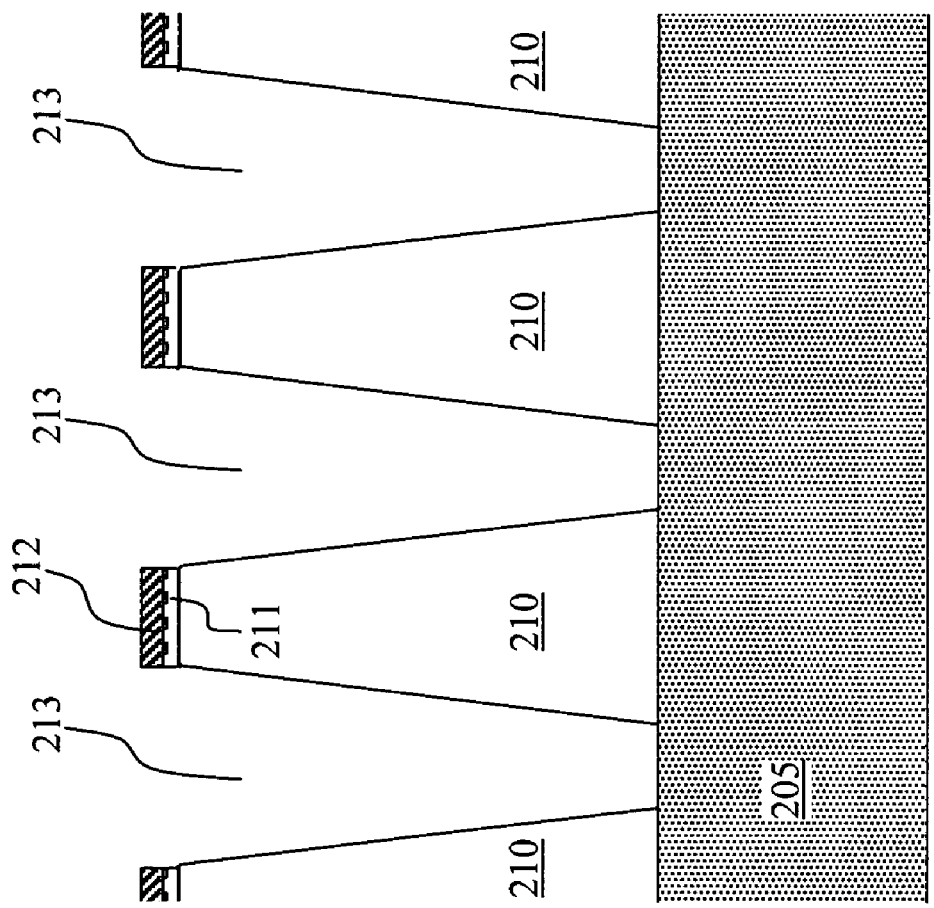
Figures 2, 10B:
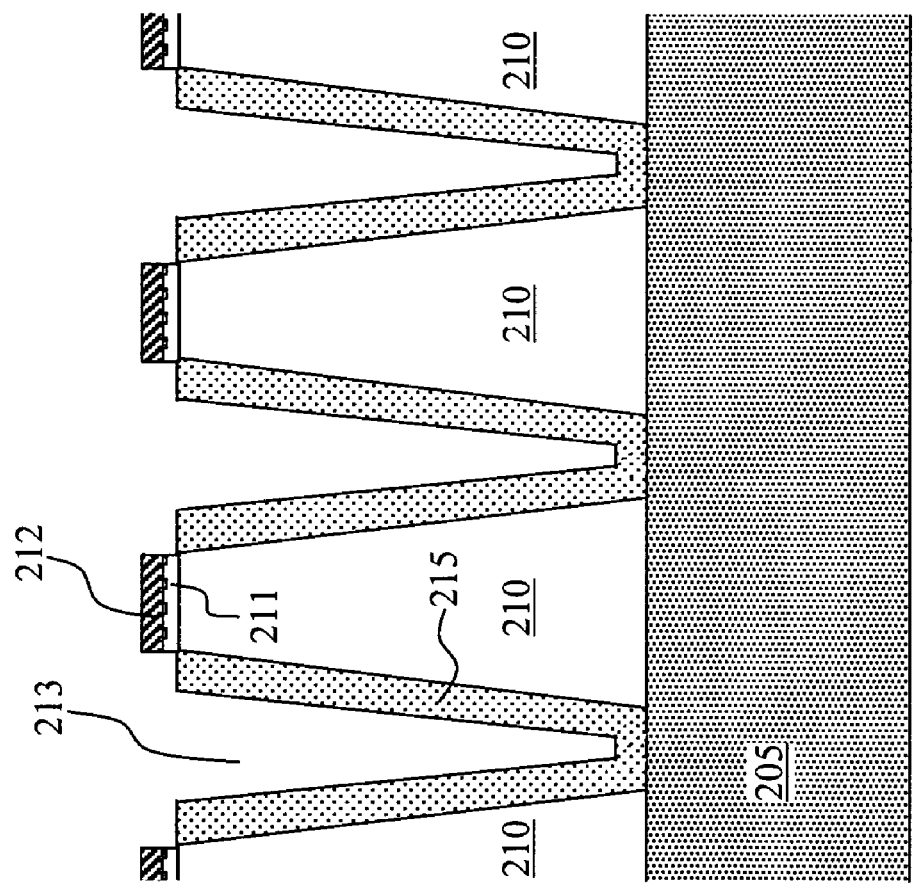
Figures 3, 10B:
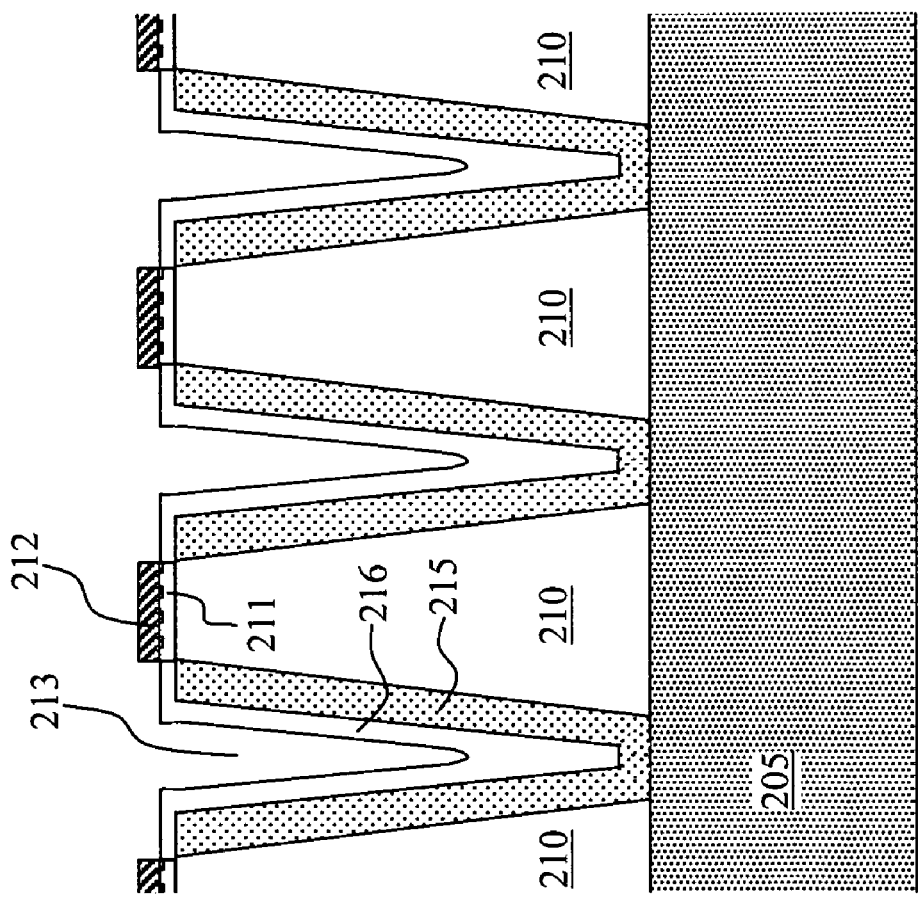
Figures 4, 10B:
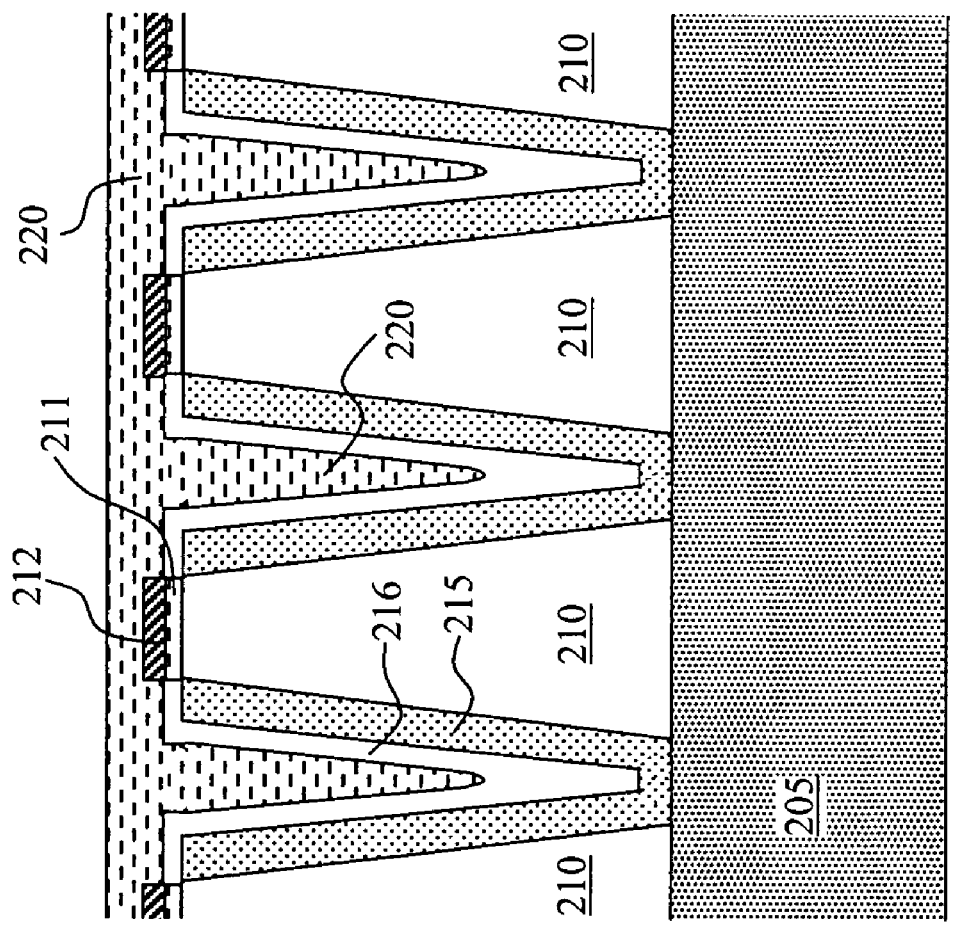

FIGS. 10A to 10I are a series of side cross sectional views illustrating the fabrication steps of a self-aligned high voltage (HV) semiconductor power device implemented with nano tubes similar to that shown in FIG. 2. FIG. 10A shows a starting N+ semiconductor substrate 205, i.e., a heavily N+ doped silicon substrate, supporting a P-type epitaxial layer 210 grown on top of the substrate 205. The P-type epitaxial layer 210 may also be viewed as an upper semiconductor substrate and the N+ semiconductor substrate 205 as a lower semiconductor substrate. The P-type epitaxial layer 210 may optionally be grown having three or more different P-dopant concentrations or may be formed to have a gradually graded dopant concentration with decreasing dopant concentration along a top to bottom direction. An oxide layer 211 and a silicon nitride (Si3N4) layer 212 are then formed to function as a hard mask. In FIG. 10B-1, a trench mask (not shown) is applied to first etch the hard mask including the oxide layer 211 and the silicon nitride layer 212. Then a silicon etch is performed to open trenches 213 into the epitaxial layer 210. The trenches 213 are opened to have a trench width of about 3.5 micrometers, a trench depth of approximately 36 to 40 micrometers and sidewall angle of approximately 88 degrees. Then, an N nanotube layer 215 having a thickness of approximately 0.25 to 0.5 micrometers doped with arsenic dopant is epitaxially grown on the sidewalls of the trench, as shown in FIG. 10B-2. A P– epitaxial layer 216 may be grown over the N nanotube layer 215. Due to the size of the trench 213 and the tilted sidewalls, the N–– epitaxial layer 216 substantially fills the bottom portion of the trench, as shown in FIG. 10B-3. A thin high density plasma (HDP) oxide layer 220 is then deposited into and fills the trenches, as shown in FIG. 10B-4.

Figure 10C:
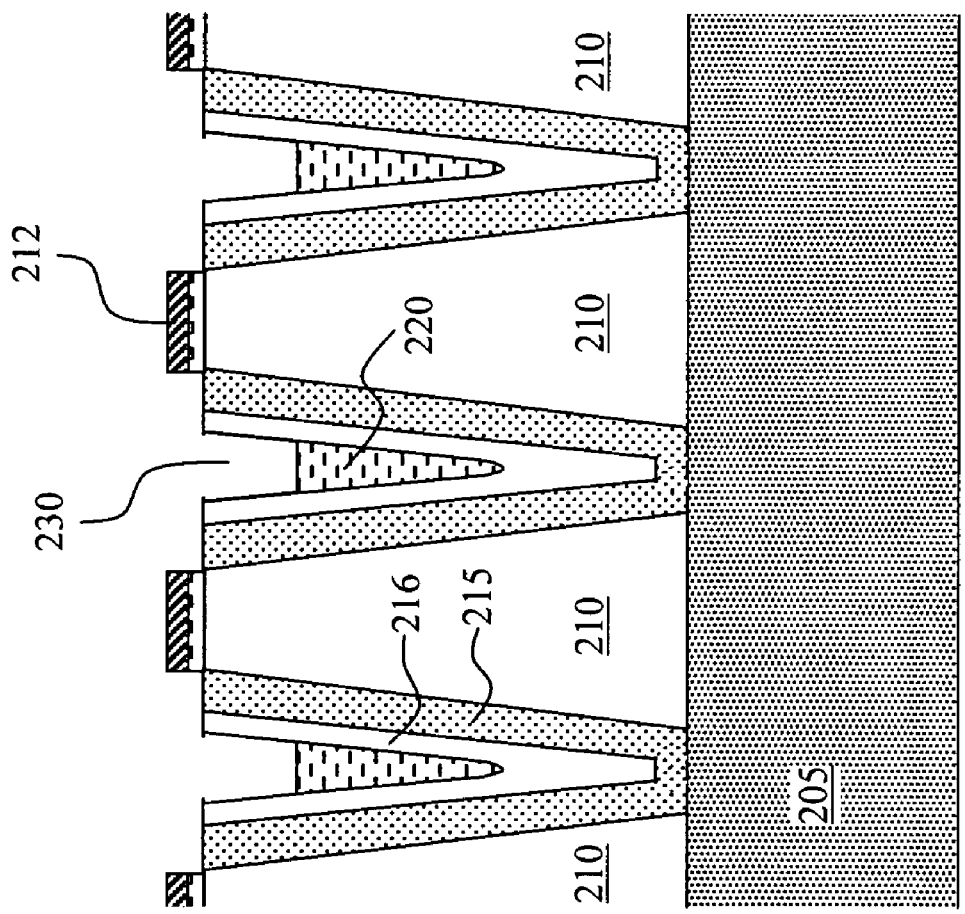
Figures 1, 10C:
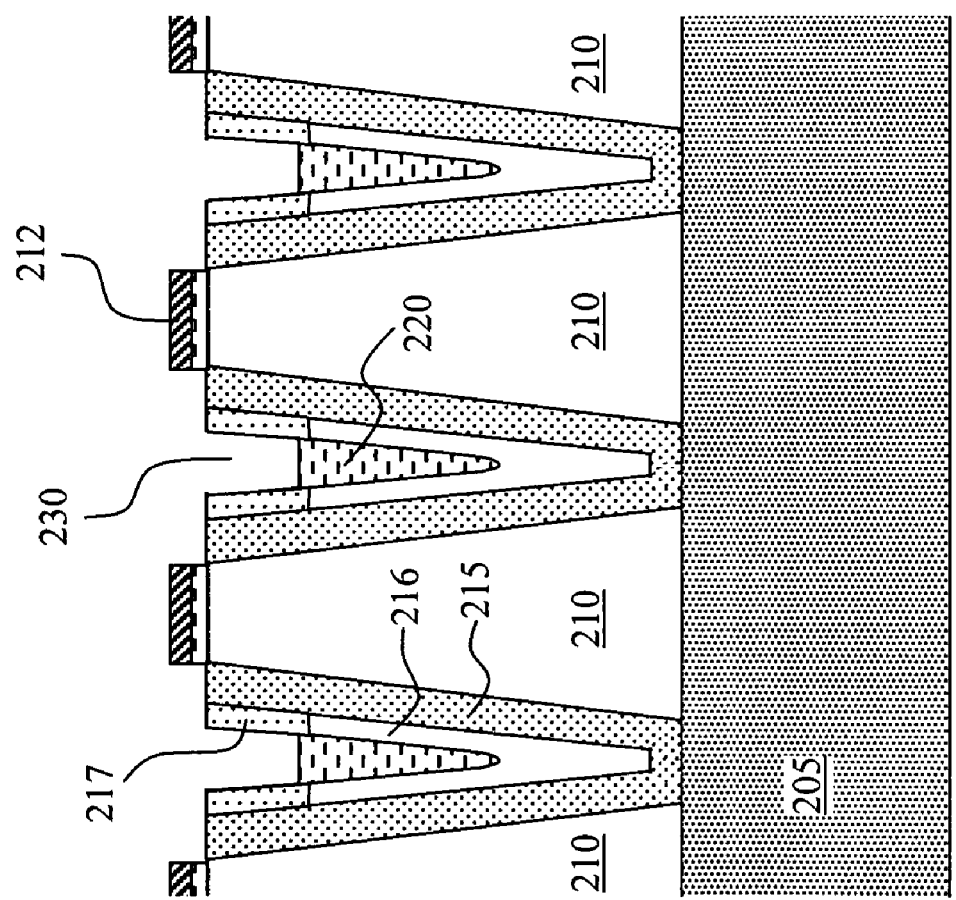

In FIG. 10C, an etch-back process and/or a chemical mechanical planarization (CMP) process are carried out to remove the silicon oxide (SiO2) 220 from the top surface until the silicon nitride layer 212 is exposed. A trench gate mask (not shown) is applied to etch the oxide layer 220 to a depth of approximately 1.5 to 2.0 micrometers. As shown in FIG. 10C-1, an N-type implantation may be performed to form N-type implants 217 on the exposed sidewalls of P– epitaxial layer 216.

Figure 10D:
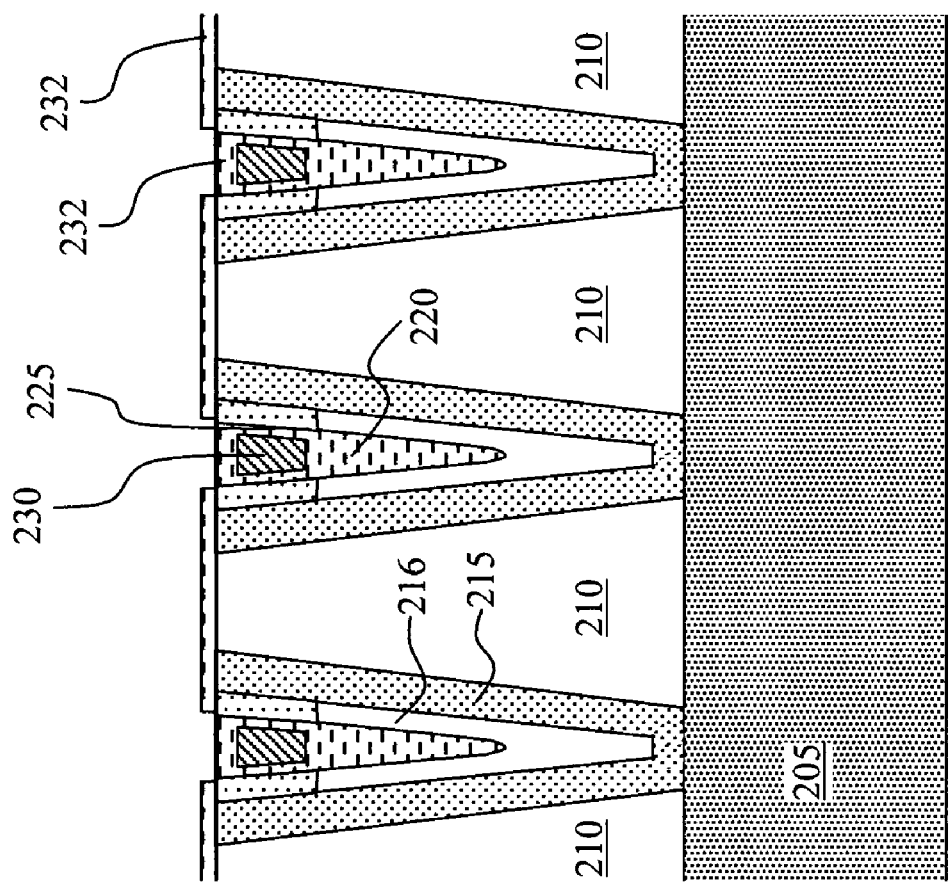

In FIG. 10D, a gate oxide layer 225 is formed covering the sidewalls along the P-epitaxial layer 216 with a thickness of approximately 350-1200 Angstroms. A gate polysilicon layer 230 is deposited that may be preferably an N+ in situ doped polysilicon layer. The polysilicon 230 is etched back and the top surface is planarized by applying a CMP process and the hard mask oxide layer 211 and silicon nitride (Si3N4) layer 212 are removed. The polysilicon layer 230 may be further etched to have a slightly recessed gate 230 with the top surface of the gate polysilicon 230 about 0.3 micrometers below the mesa surface level. A pad oxide layer 232 is then grown on the top surface.

Figure 10E:
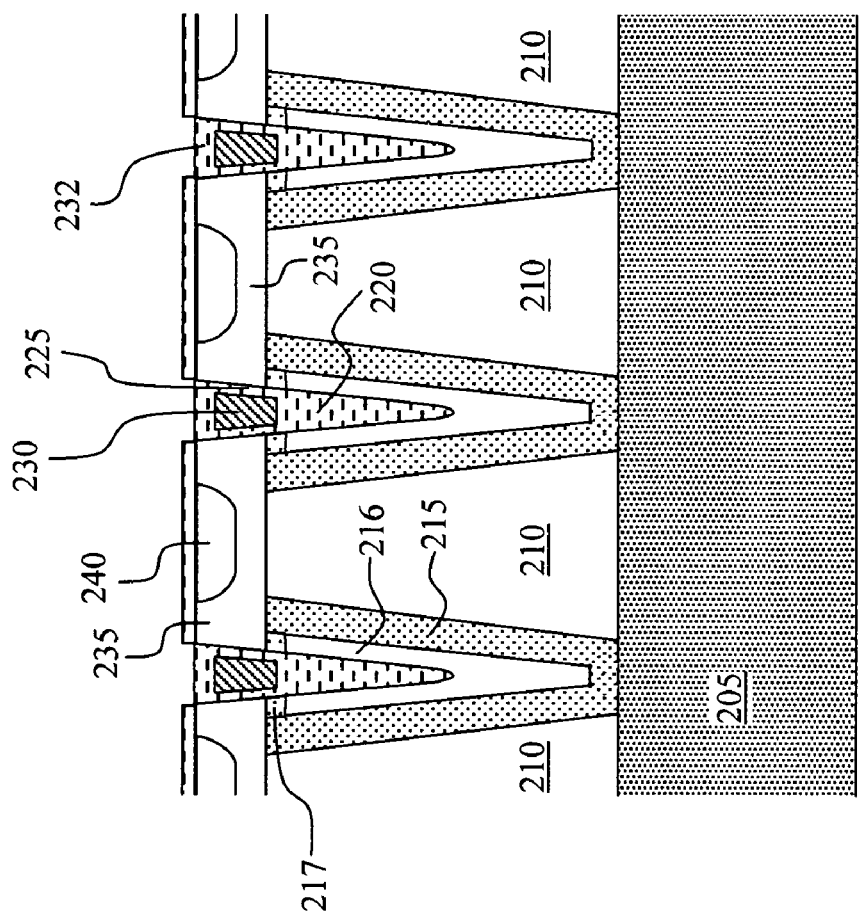
Figure 10F:
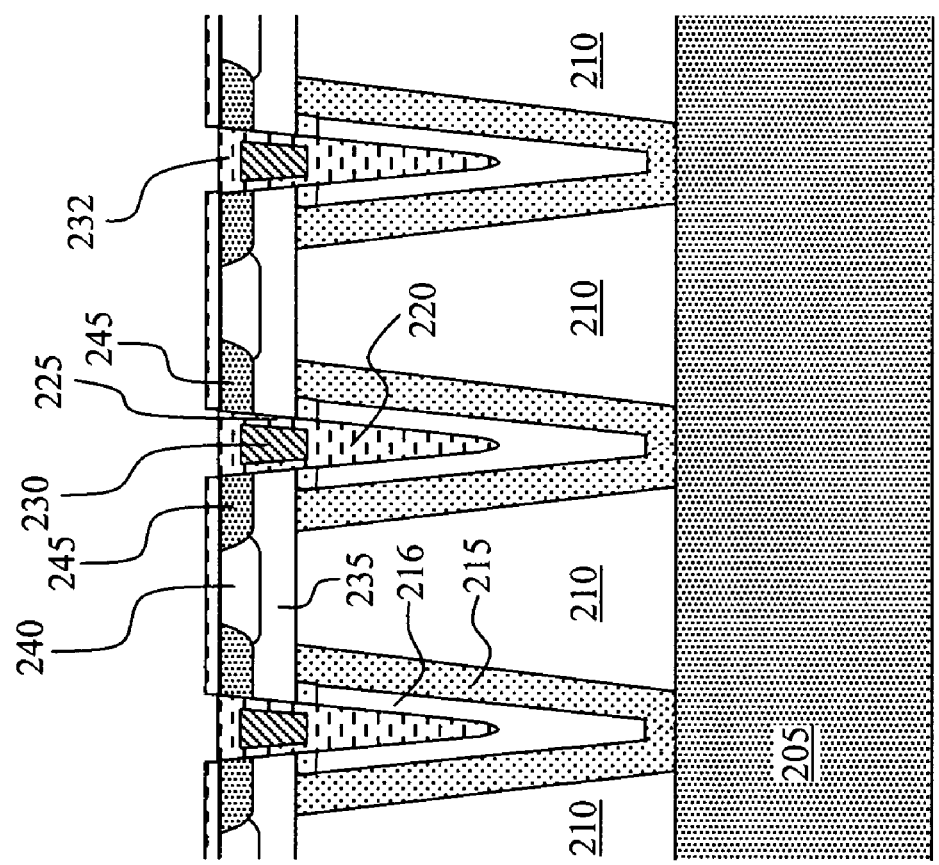

In FIG. 10E, a high energy boron or P-body dopant implant is carried out to form the body regions 235. The high energy body dopant implant is carried out with a tilt angle to prevent shadowing in the regions next to the trench sidewalls due to the negative mesa angles from the trench sidewalls. A body dopant drive is carried out at an elevated temperature to diffuse the body regions 235 into the P-epitaxial layer 210 and N nano tube layer 215 and N–– epitaxial layer 216. Then, a heavy boron implant close to zero degrees is carried out to form the P+ body contact regions 240 near the top surface above the body regions 235. In FIG. 10F, a source mask (not shown) is applied to carry out a low energy phosphorous N+ implant to form the N+ source region 245 encompassed in the P-body regions 235 and the P+ region 240. An anneal process is carried out for implant activation at about 900 Celsius degrees for about 30 minutes. In an alternative embodiment, N type implants at a higher energy may be performed to create buried N type regions below P-body region 235, serving the same purpose of connecting the MOSFET channel region to the N epitaxial layer 215 as N-type implants 217.

Figure 10G:
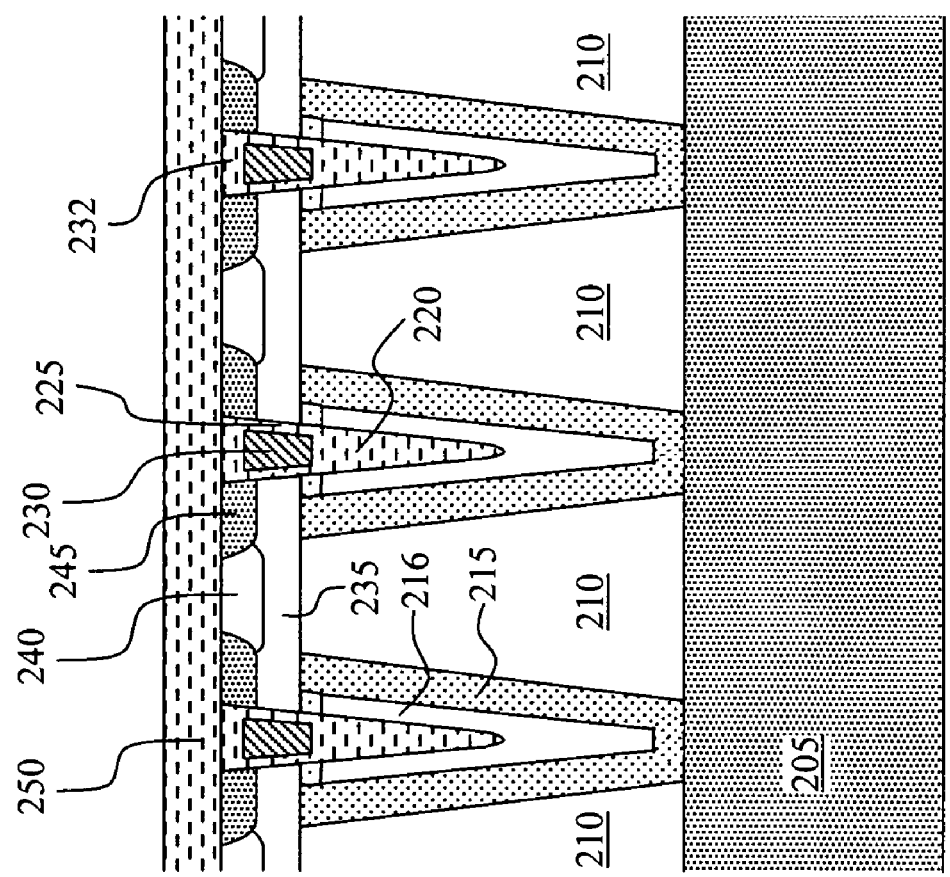
Figure 10H:
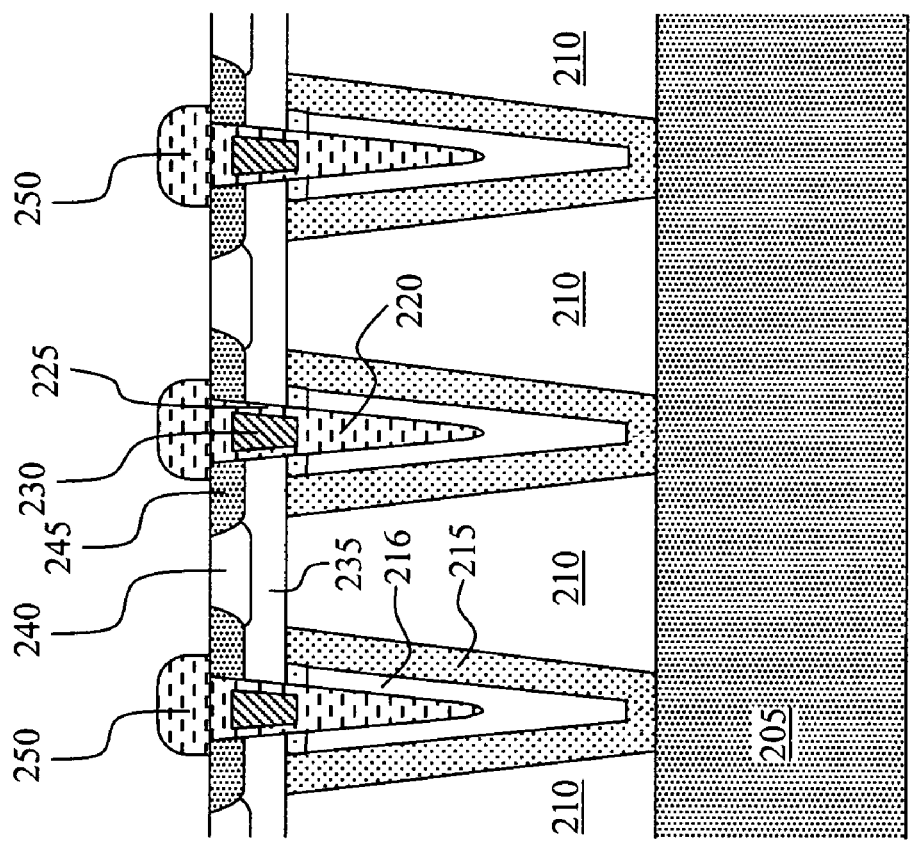
Figure 10I:
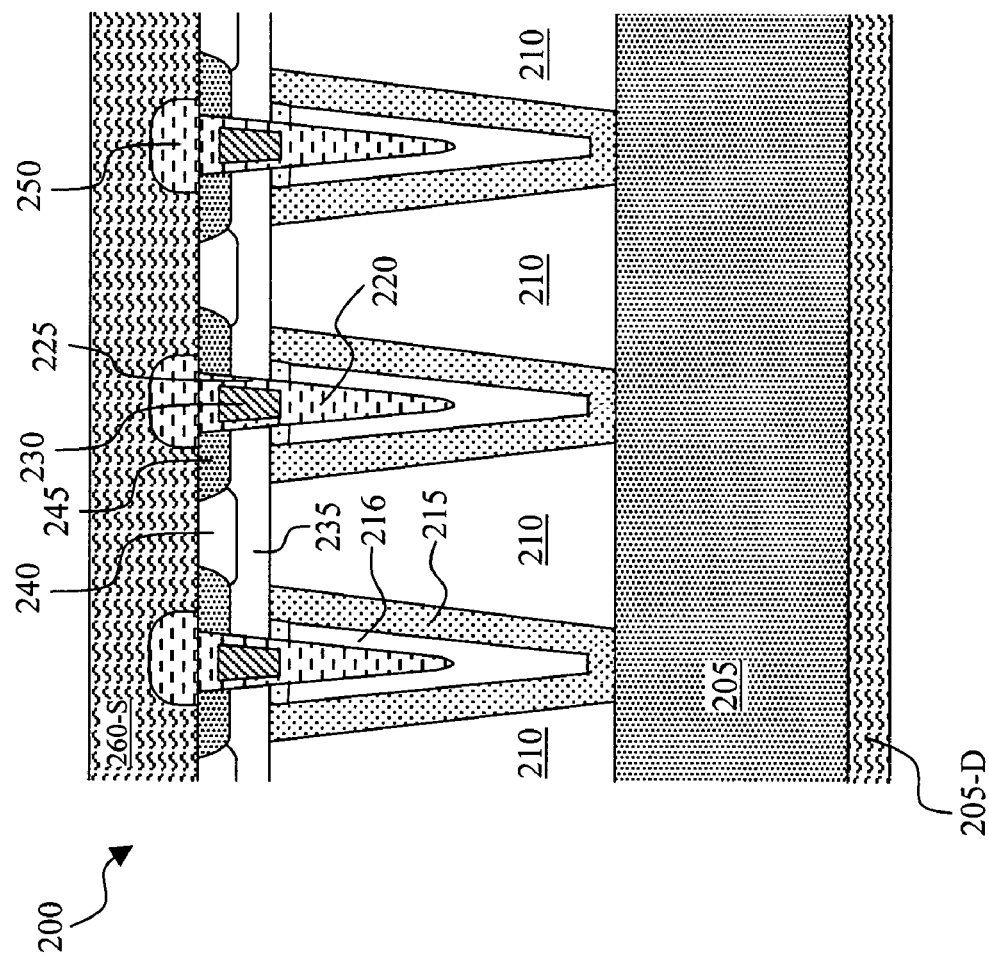

Next, a silicon nitride (Si3N4) hard mask layer (not shown) is formed on the top surface. A termination mask (not shown) is applied to carry out an isotropic silicon etch in the termination area to open trenches (not shown) in the mesa area in the termination area between the silicon oxide layer followed by filling the etched mesa trenches with dielectric or SiO2, e.g., shown as the dielectric layer 190 in FIG. 9. The dielectric layer 190 is then etched back till the hardmask layer is exposed and then the hardmask (not shown) is etched and removed. These steps in the termination region are shown in FIG. 11. A BPSG passivation layer 250 is then deposited as shown in FIG. 10G. In FIG. 10H, a contact mask (not shown) is applied to open contact openings through the BPSG layer 250. In FIG. 10I, a metal layer is deposited on the top surface and then a metal mask (not shown) is applied to pattern the metal layer into source metal 260-S and gate pad (not shown). A metal layer is also formed on the bottom of the substrate 205 to form drain metal 205-D, to complete the super junction nano tube MOSFET 200.

Figure 11A:
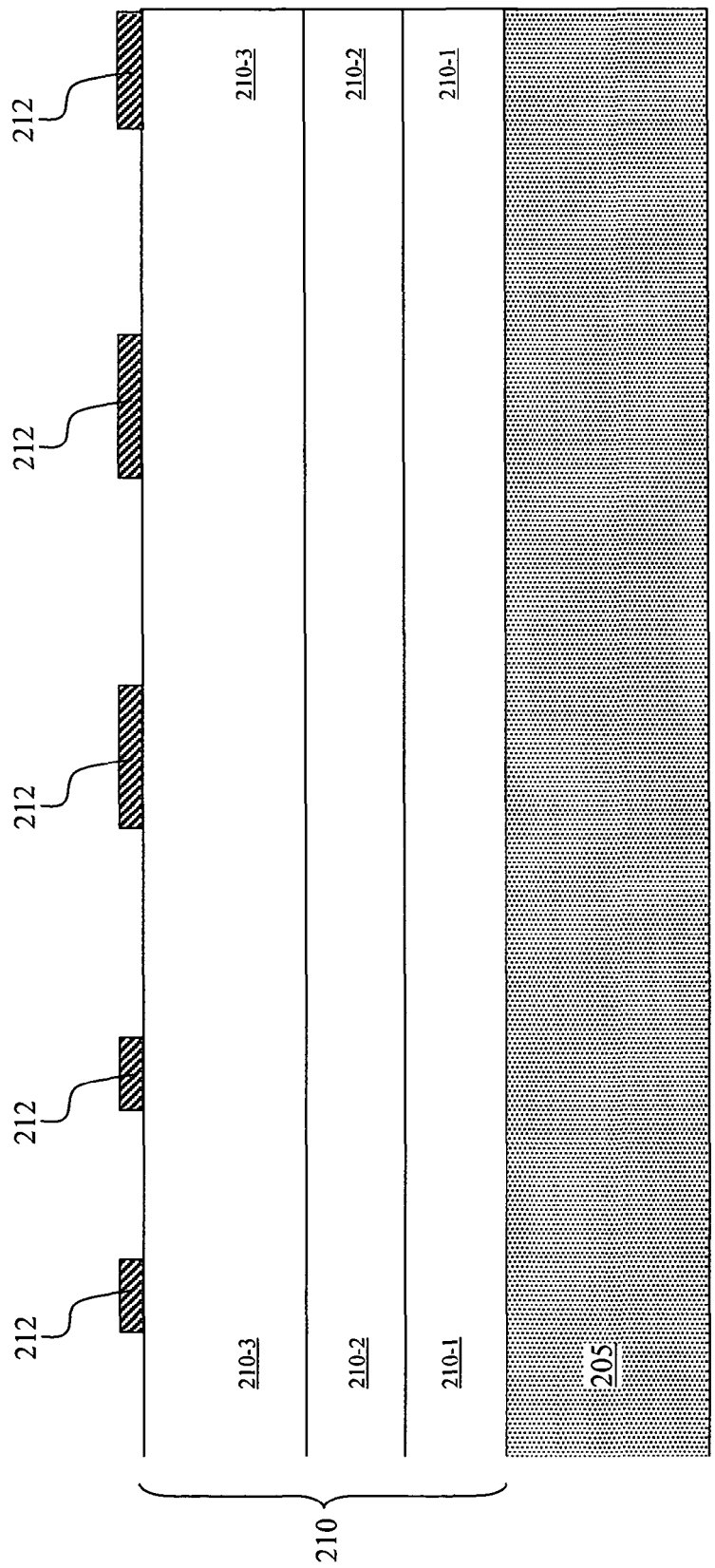
FIGS. 11A to 11G are a series of cross sectional views for showing the manufacturing processes corresponding to the manufacturing processes to configure the termination area of this invention.
Figures 1, 11B:
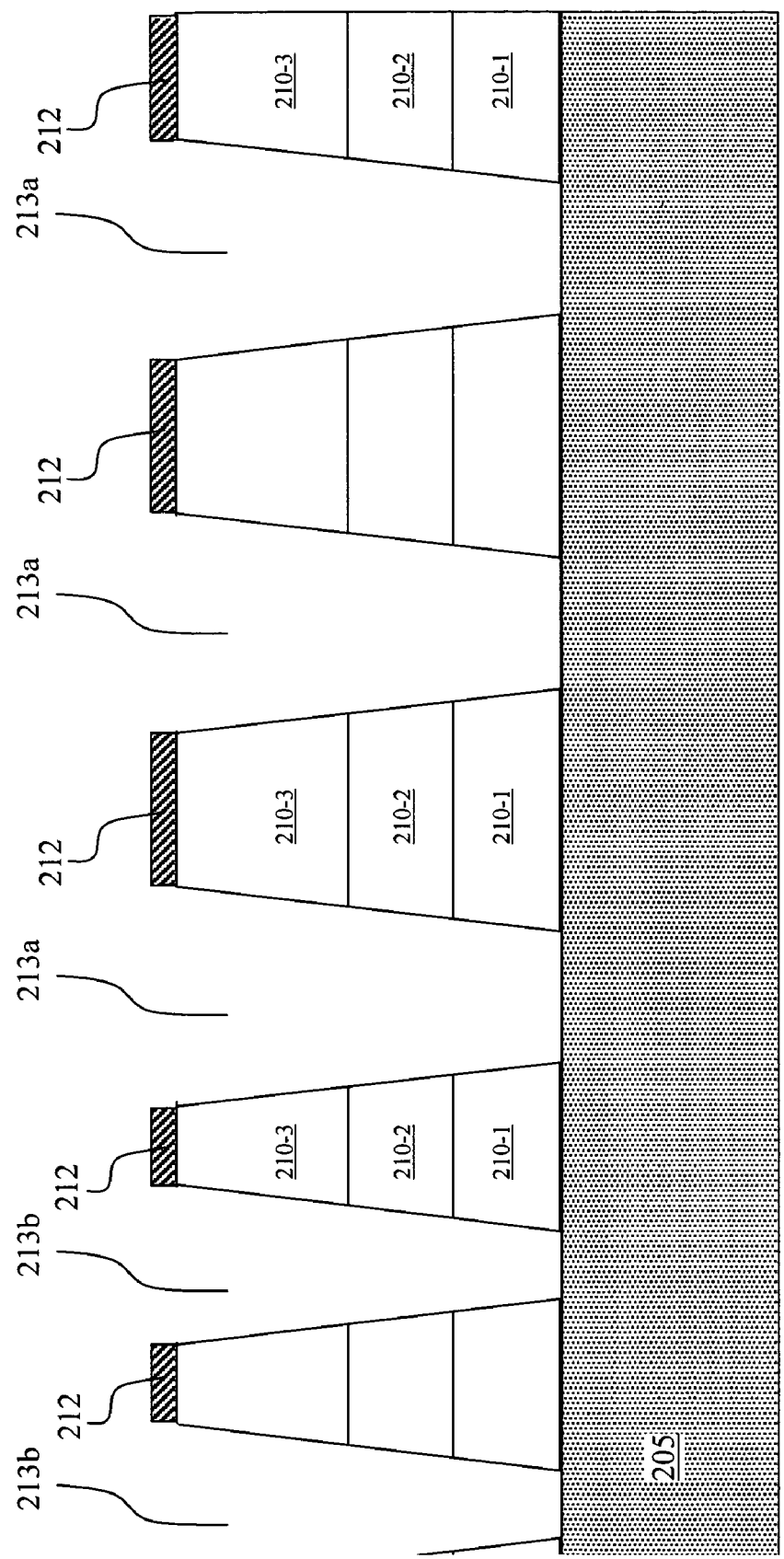
Figures 2, 11B:
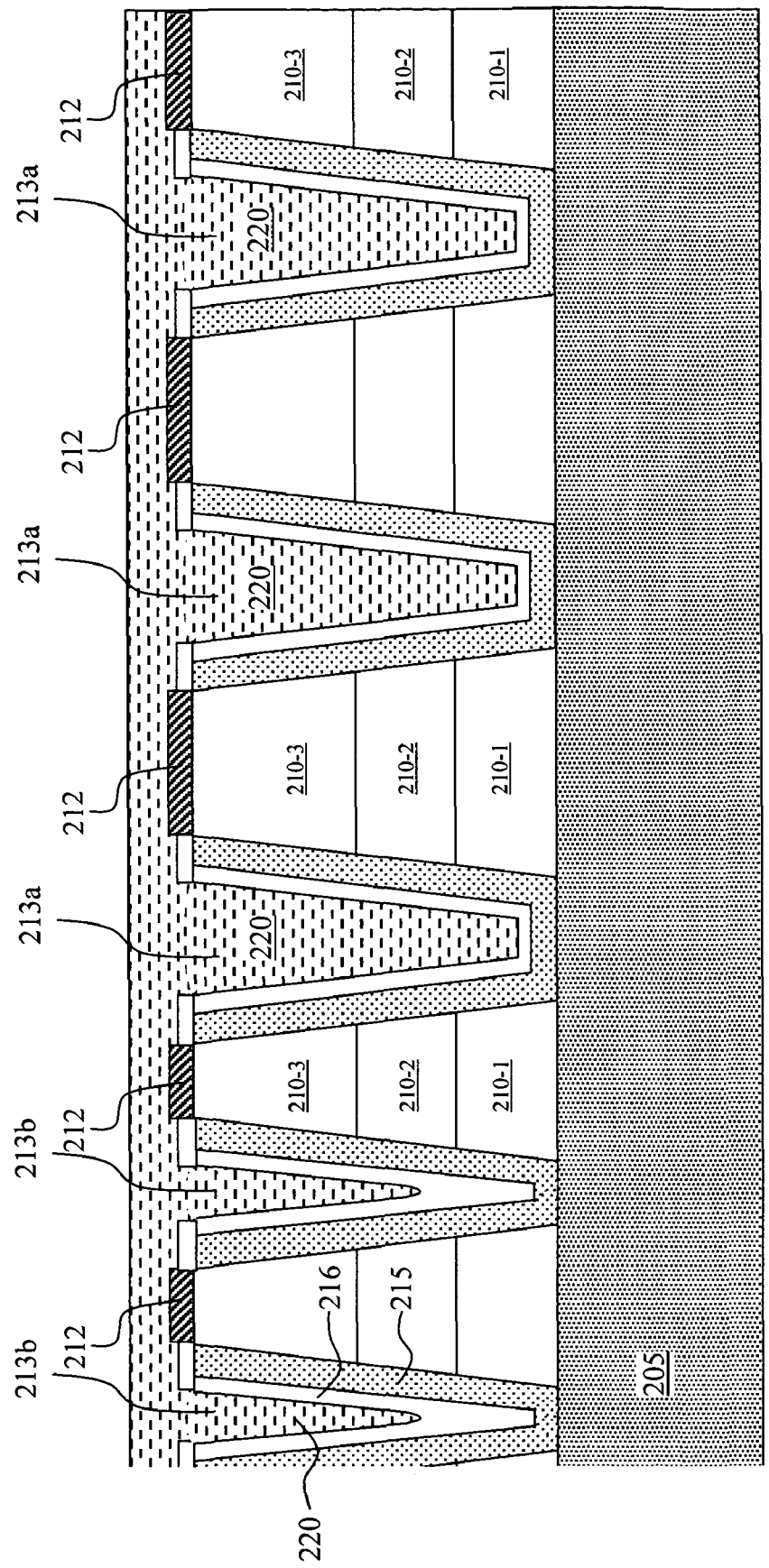
Figures 3, 11B:
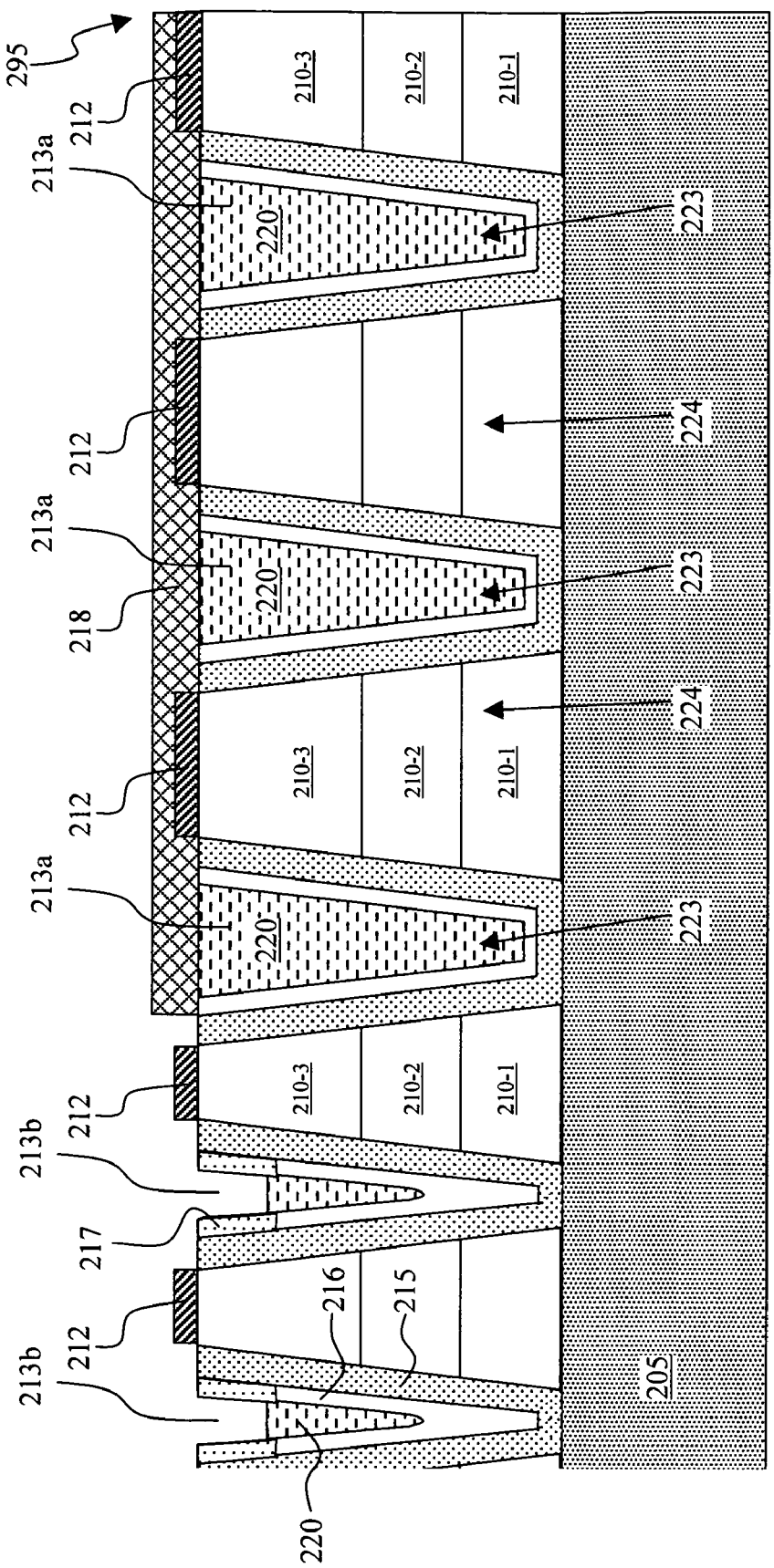
Figures 4, 11B:
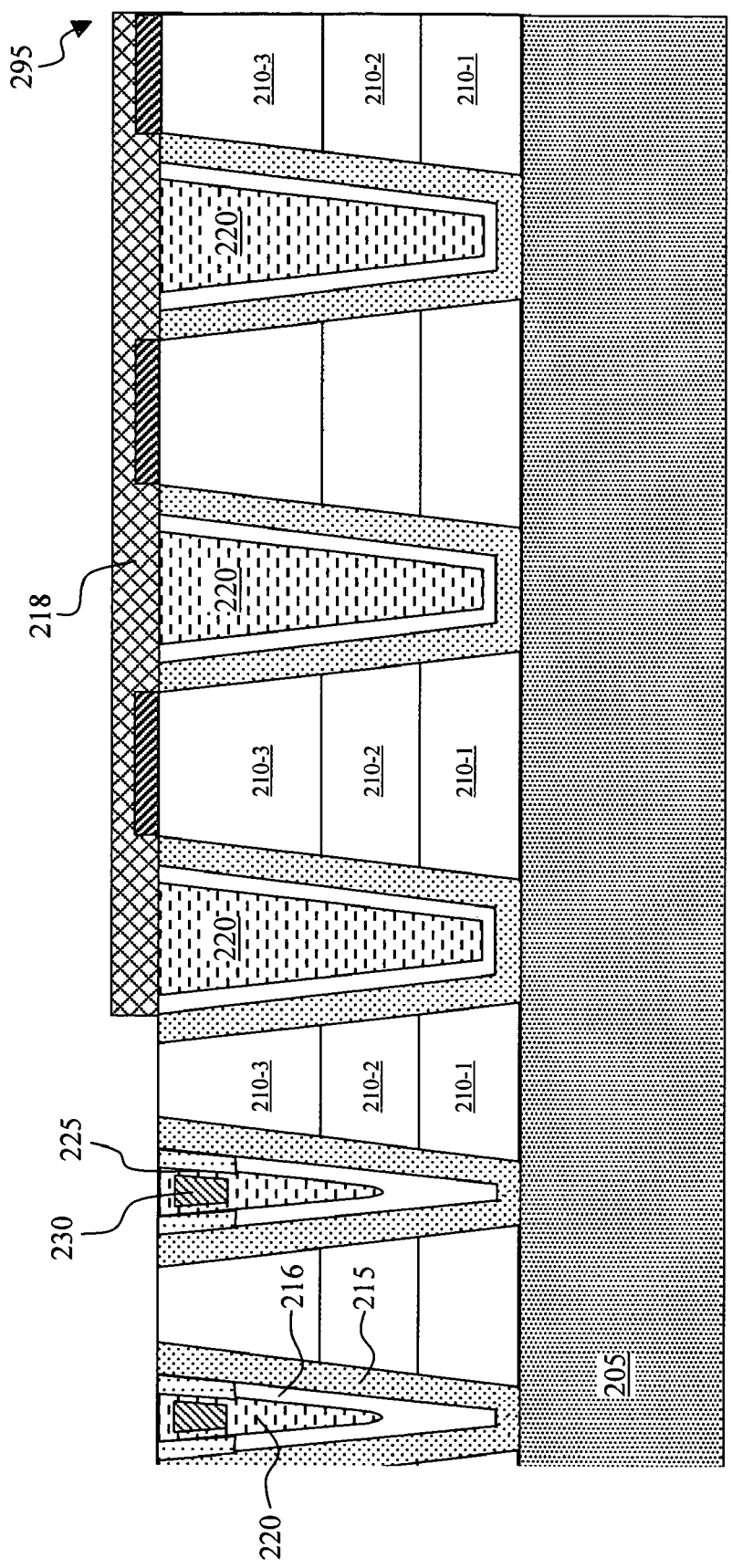
Figure 11C:
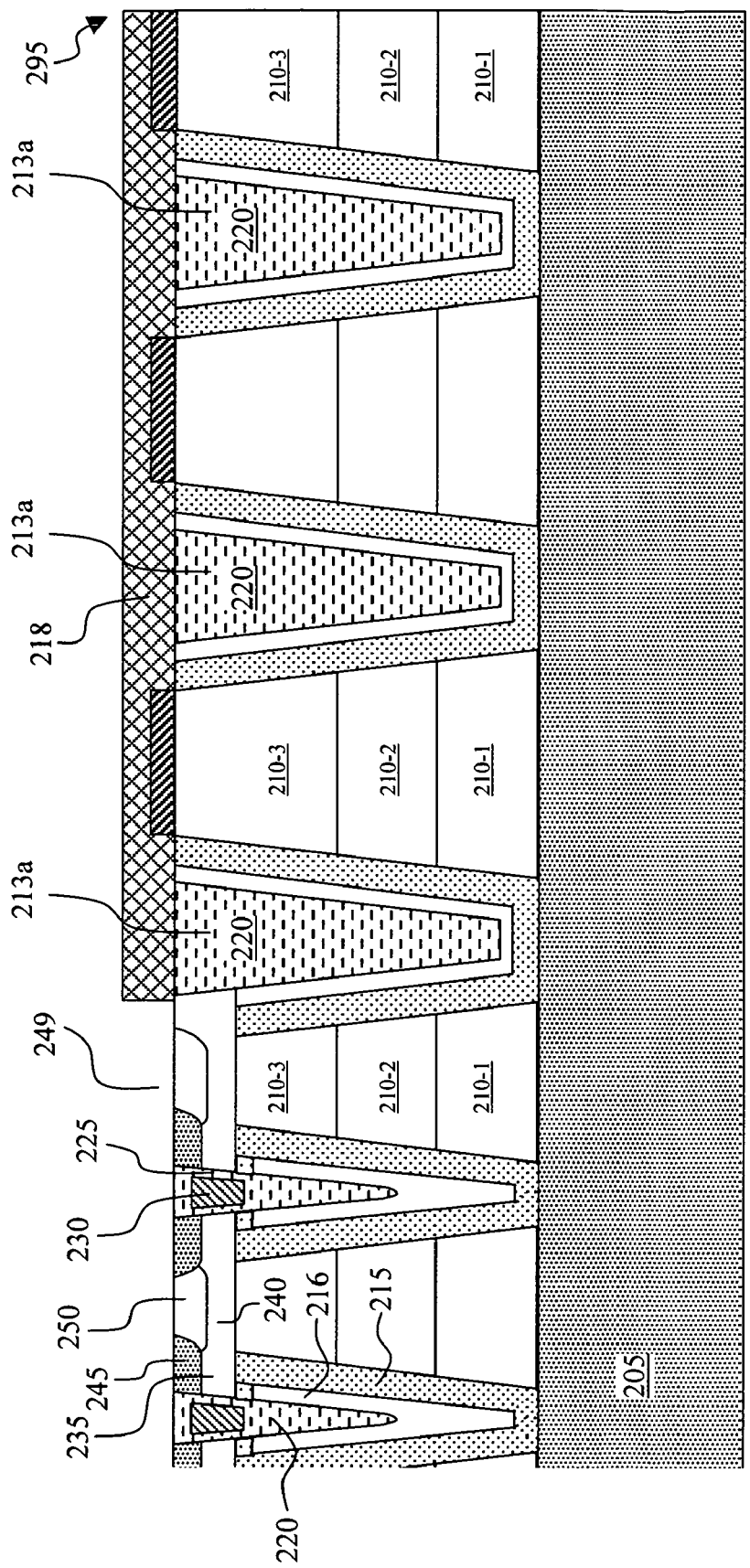

Referring to FIGS. 11A to 11G for a serial of side cross sectional views to illustrate the fabrication steps of the termination area of a self-aligned high voltage (HV) semiconductor power device implemented with nano tubes as that shown in FIG. 2. FIG. 11A shows a starting N+ semiconductor substrate 205, e.g., a heavily N+ doped silicon substrate, supporting a P-type epitaxial layer 210 that is grown as layers 210-1, 210-2, and 210-3 with three different dopant concentrations on top of the substrate 205. The P-type epitaxial layer 210 may also be grown with a gradually graded dopant concentration with gradually decreasing dopant concentration along a top to bottom direction. An oxide layer and a silicon nitride (Si3N4) layer 212 are then formed to function as a hard mask. In FIG. 11B-1, a trench mask (not shown) is applied to first etch the hard mask 212 including an oxide layer and a silicon nitride layer. Then a silicon etch is performed to open active trenches 213b and termination trenches 213a into the epitaxial layer 210. The trenches are opened to have a trench depth of approximately 36 to 40 micrometers and sidewall angle of approximately 88 degrees. The width of the termination trenches 213a may be larger than the active area trenches 213b to ensure that the oxide fill in those trenches reaches the bottom, as will be shown. Then, an N-epitaxial nano tube layer 215 having a thickness of approximately 0.25 to 0.5 micrometers doped with arsenic dopant is epitaxially grown on the sidewalls of the trenches 213a and 213b, followed by epitaxially growing a P– epitaxial layer 216 over the N nano tube 215. A thin HDP oxide layer 220 is then deposited into the trenches, filling them, as shown in FIG. 11B-2. Note that due to the larger width of the termination trenches 213a, the P– epitaxial layer 216 substantially fills the bottom portion of active area trenches 213b and only covers a thin lining of termination trenches 213a. Consequently, the oxide layer 220 fills to a much lower depth in the termination trenches 213a than in active trenches 213b. Wider trenches with deeper and wider oxide fills can also be used at the boundary regions to separate different devices when they are formed on the same semiconductor die.

Figure 11D:
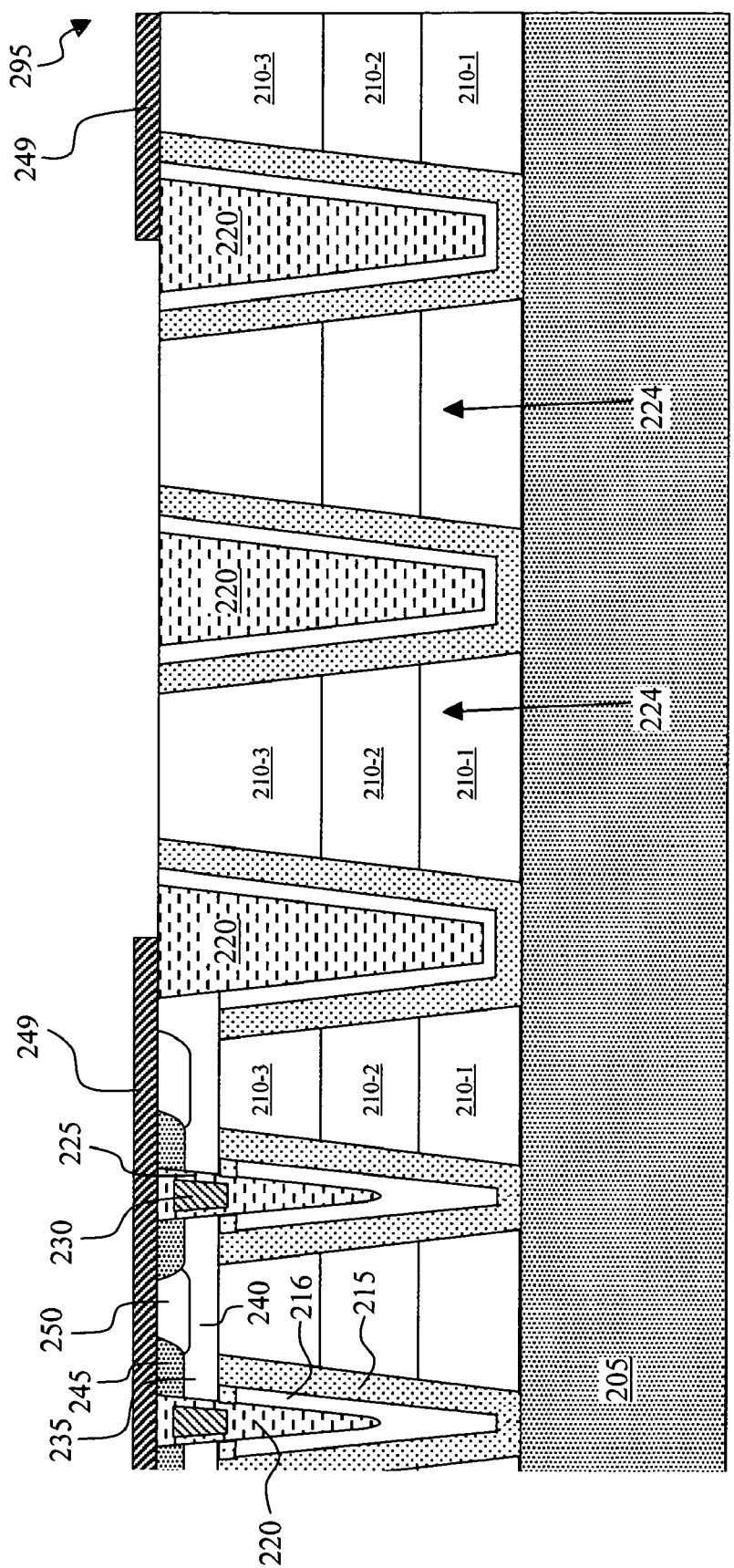
Figure 11E:
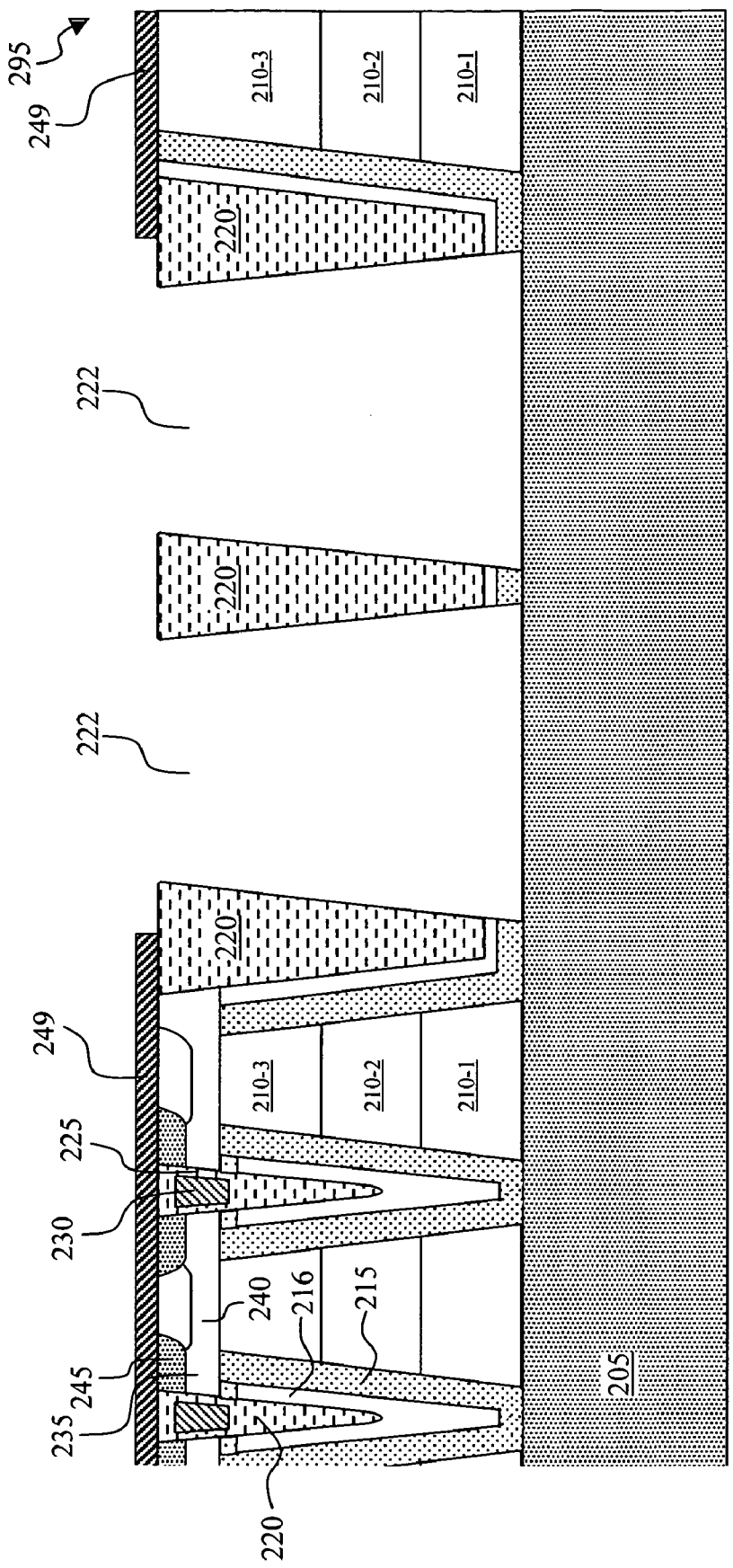
Figure 11F:
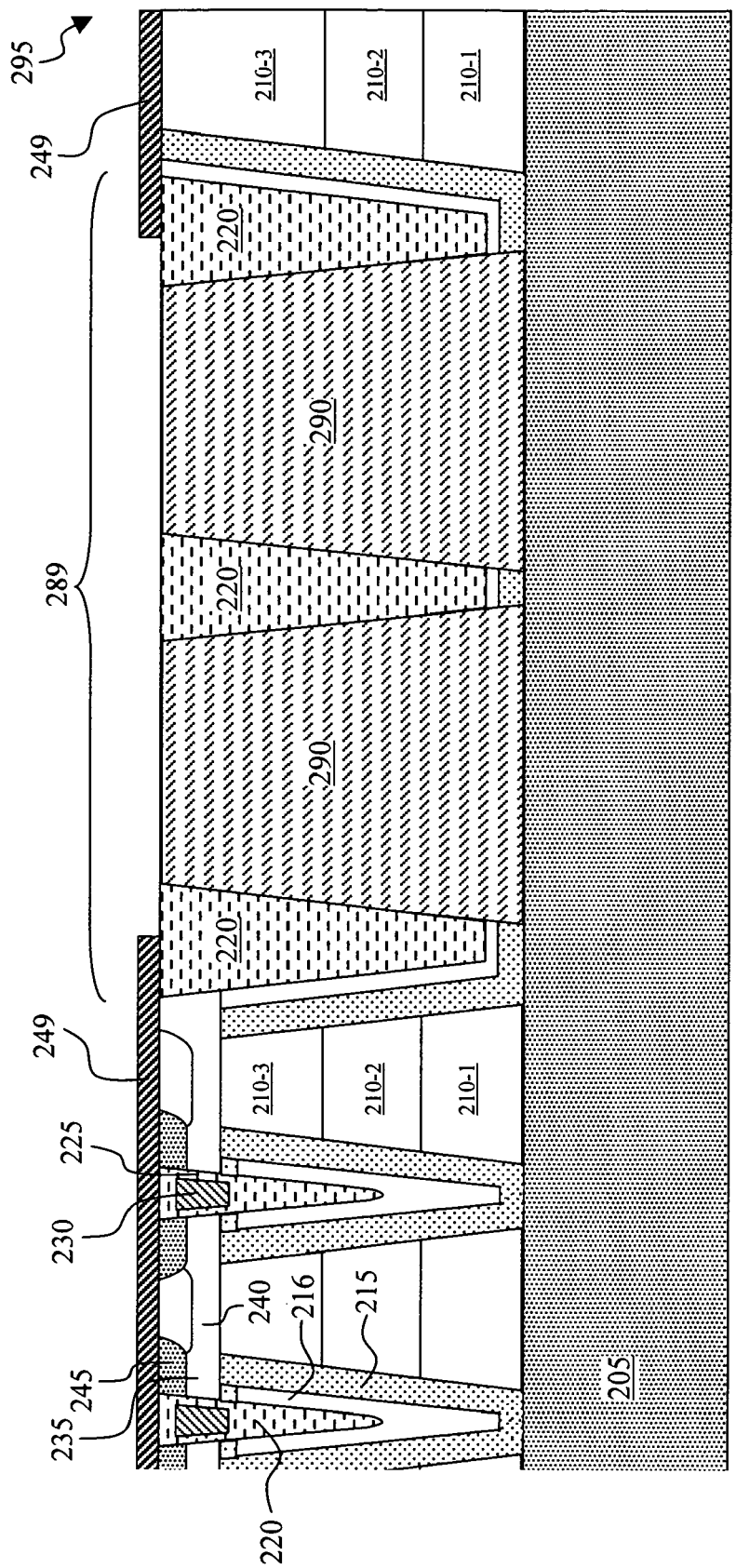
Figure 11G:
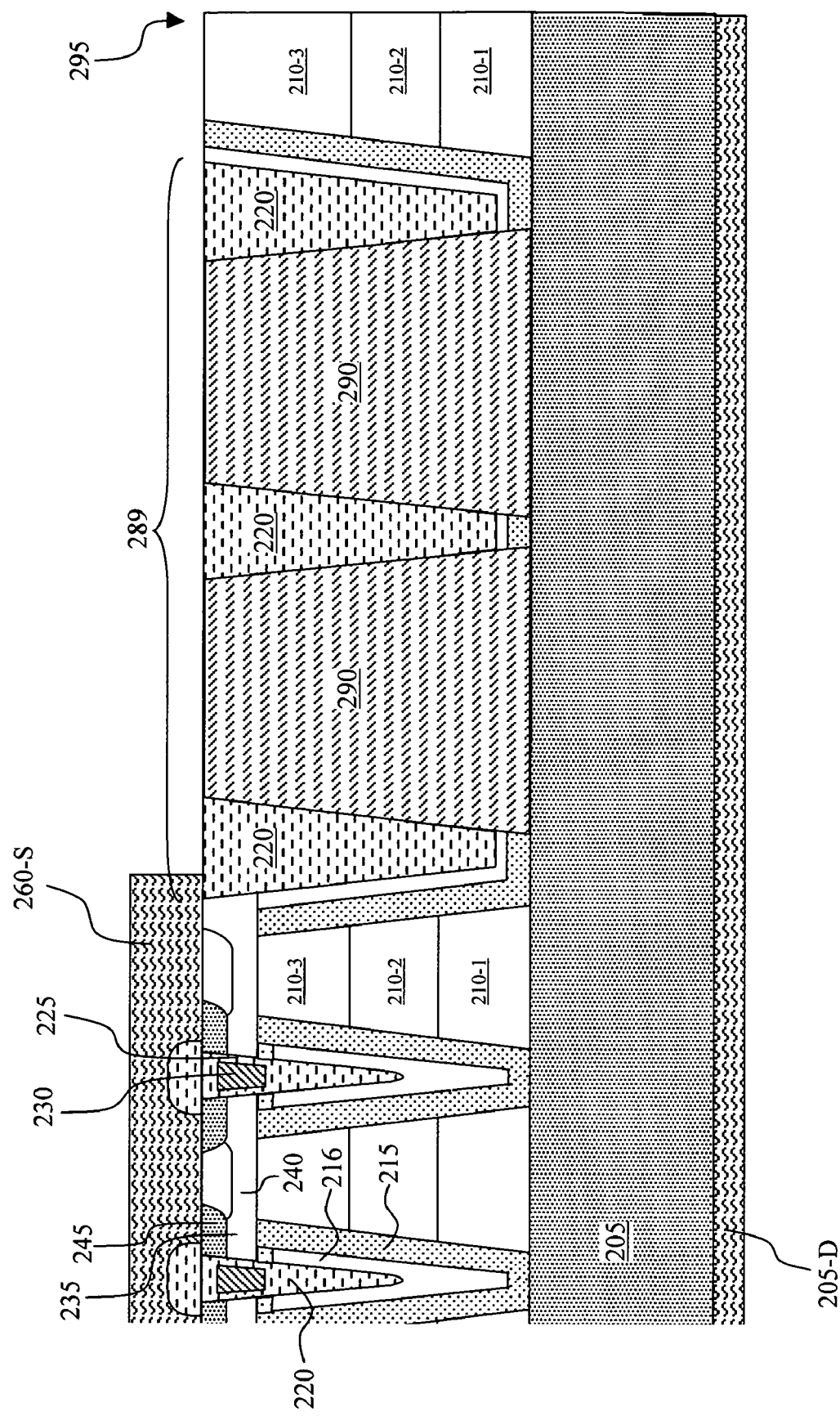

Then an etch-back process and/or chemical mechanical planarization (CMP) process are carried out to remove the oxide layer 220 from the top surface until the silicon nitride layer 212 is exposed. At this point, a network of oxide columns 223 is formed in the termination region, with semiconductor mesas 224 contained within the network. A trench gate mask 218 is applied that covers the termination area covering the wide trenches 213a to etch the oxide layer 220 in the active area trenches 213b. Then an N-type implant can be performed to form N− type implant regions 217 along the exposed sidewalls of P− epitaxial layer 216, as shown in FIG. 11B-3. This is followed by forming the polysilicon gate 230 padded by gate oxide layer 225 as shown in FIG. 11B-4. The hard masks 212 may be removed from the active area at this point. Then the P-body base regions 235 and the heavily P+ regions 240 are formed as that described above. A source mask (not shown) is applied to implant and form the N+ source regions 245 in the active cell area as described above, and as shown in FIG. 11C. In FIG. 11D the trench gate mask 218 is removed along with remaining hard mask 212 and a termination hard mask 249 is applied. In FIG. 11E, a silicon etch is carried out to etch the semiconductor mesas 224, i.e., epitaxial layer 210-1, 210-2 and 210-3, between the oxide layers 220 of the termination area, leaving interim etched trenches 222. In FIG. 11F, the etched trenches 222 between the oxide layers 220 in the termination area are filled with dielectric material 290 to fill the etched mesas in the termination area, forming wide and deep termination oxide trench 289. In FIG. 11G, the termination hard mask 249 is removed and further processing steps as that described in FIGS. 10G to 10I are performed to complete the manufacture of the MOSFET device with the specially configured termination area as shown in FIG. 9.

Figure 12A:
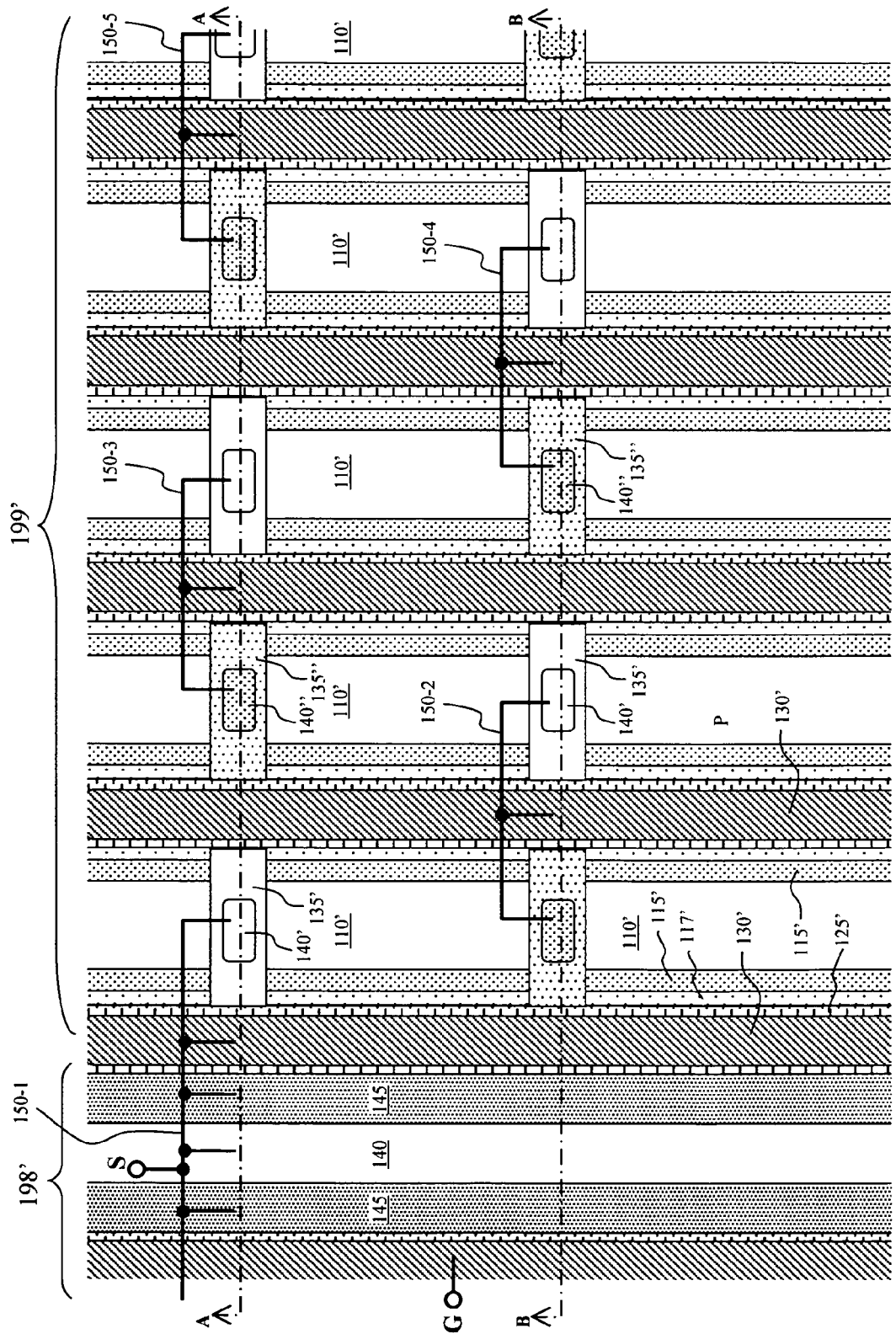
FIG. 12A is a top view and FIGS. 12B and 12C are cross sectional views of a planar termination of this invention and FIG. 12D shows the voltage profile of the pinch off steps across the termination area.
Figure 12B:
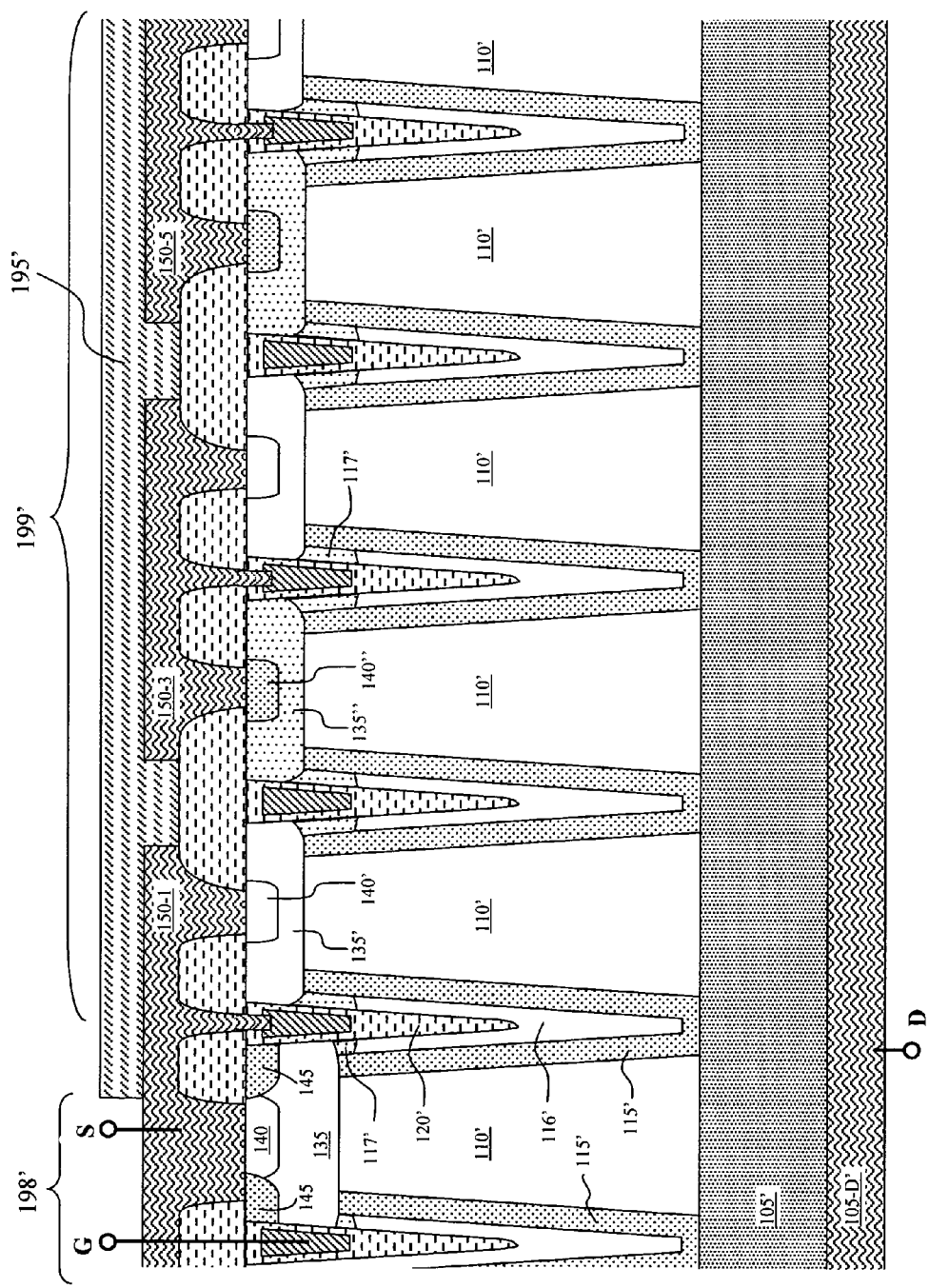
Figure 12C:
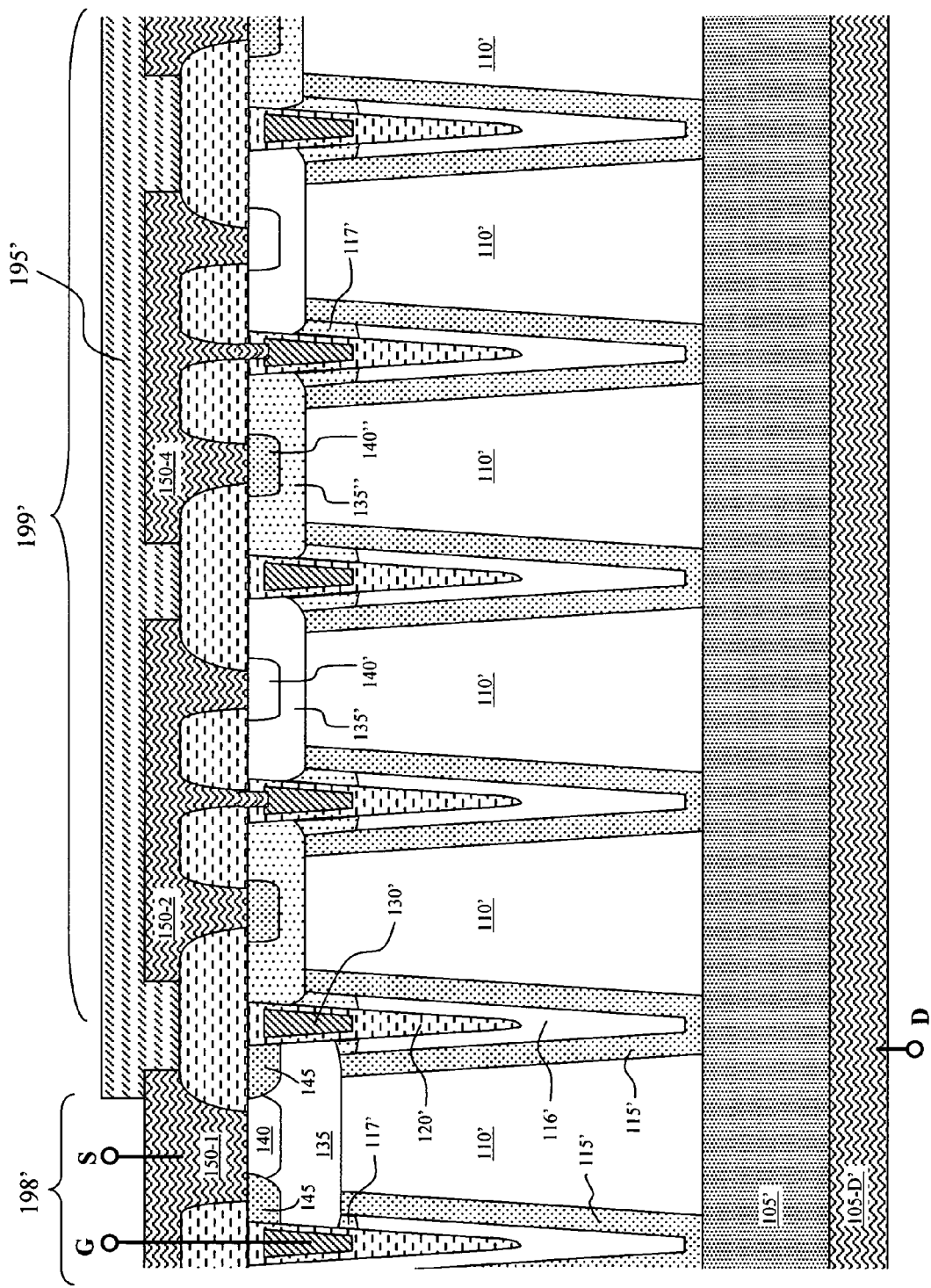

FIG. 12A is a top view and FIGS. 12B and 12C are cross sectional views along the lines A-A' and B-B' respectively of a MOSFET device of FIG. 12A with a planar termination configuration. The top view does not show the top layers of metal, oxide, and passivation for clarity, though the electrical connections formed by the metal layers are indicated schematically. The planar termination is an alternate embodiment of the wide oxide trenches as shown in FIGS. 9 and 11G. In the planar termination configuration, the termination area 199' includes mesas 110' between the oxide layers 120' filling in the trench with sidewalls covering with N doped epitaxial layers 115' are similar to the active area. The termination cells do not have the source/body regions 135, 140 and 145 of the active cells 198'. Instead, the P-mesa and the N-epitaxial layers are connected by the metal layers 150-1 to 150-5 as shown in FIGS. 12A to 12C so that each termination cell blocks a specific pinch-off voltage $V_{PT}$. A passivation layer 195' may cover the metal layers 150-1 to 150-5.

Figure 12D:
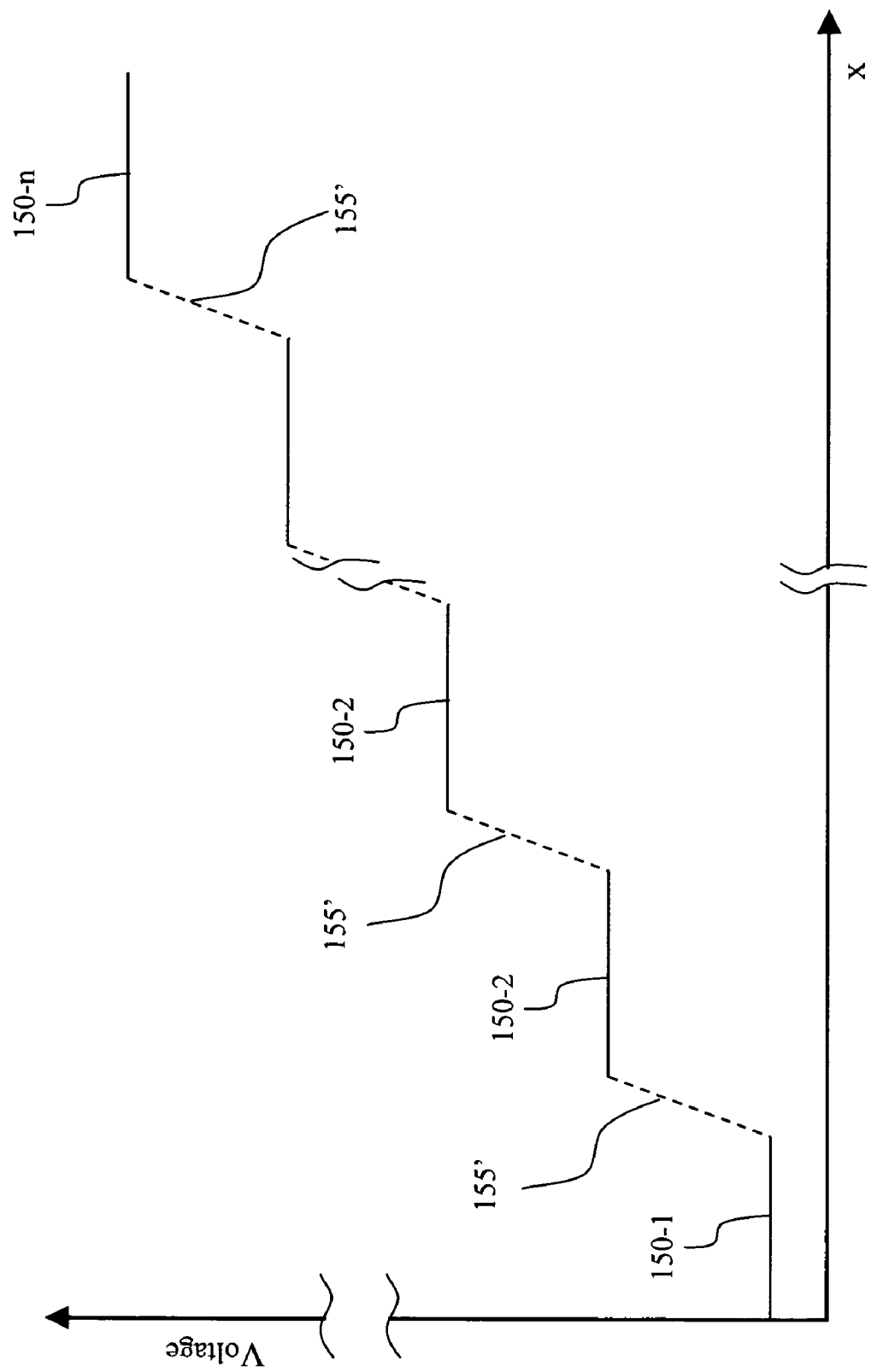

The last active cell (shown on the left in the figures), which is at source voltage=0 volts, is shorted through the metal layer 150-1 to the P-mesa of the first termination cell (and to the polysilicon block 130' in between). More specifically, the metal layer 150-1 contacts the P+ region 140' within P region 135'. The P-mesa 110' and the surrounding N-epi layers 115' deplete, raising the voltage of the N-epi to the pinch-off voltage, $V_{PT1}$, i.e., the voltage at which the N-epi and P-mesa deplete. The N-epi 115' is connected to the N region 135" encompassing N+ region 140" of that first termination cell which is shorted to the P-mesa in the next termination cell (the next cell to the right) by metal layer 150-2, which increases the voltages by another $V_{PT1}$ due to the depletion in that cell, so that the total voltage at that point is $V_{PT2} \approx 2*V_{PT1}$. This continues until the device operating voltage (drain voltage) is reached. Referring to FIG. 12D, starting with the source potential as a reference voltage, e.g., V=0 at the metal layer 150-1, the voltage is increased in a stepwise manner by pinch-off steps 155 which take place in the semiconductor mesas, so that at metal layer 150-2, the voltage is $V_{PT1}$. The voltage is raised incrementally to $V_{PT1}$, then to $V_{PT2}$ at metal layer 150-3, and up to the device voltage that may be a designed value of 600 volts at the last metal layer 150-n as shown in FIG. 12D immediately next to a scribe line at the edge of the semiconductor chip.

The polysilicon blocks 130' within the oxide trenches 120' are formed to prevent charges and contaminants from entering the oxide of the oxide trenches, thus improving reliability of the device. This planar termination configuration is not as compact as the wide oxide trench termination of FIG. 9 due to the fact that the planar termination scheme requires more lateral distance to block the operating voltage than the wide oxide trench. It should also be noted that the trenches opened in the termination area to fill with the silicon oxide are formed with slightly tilted sidewalls like the trenches in the active cell areas described above.

Figure 13A:
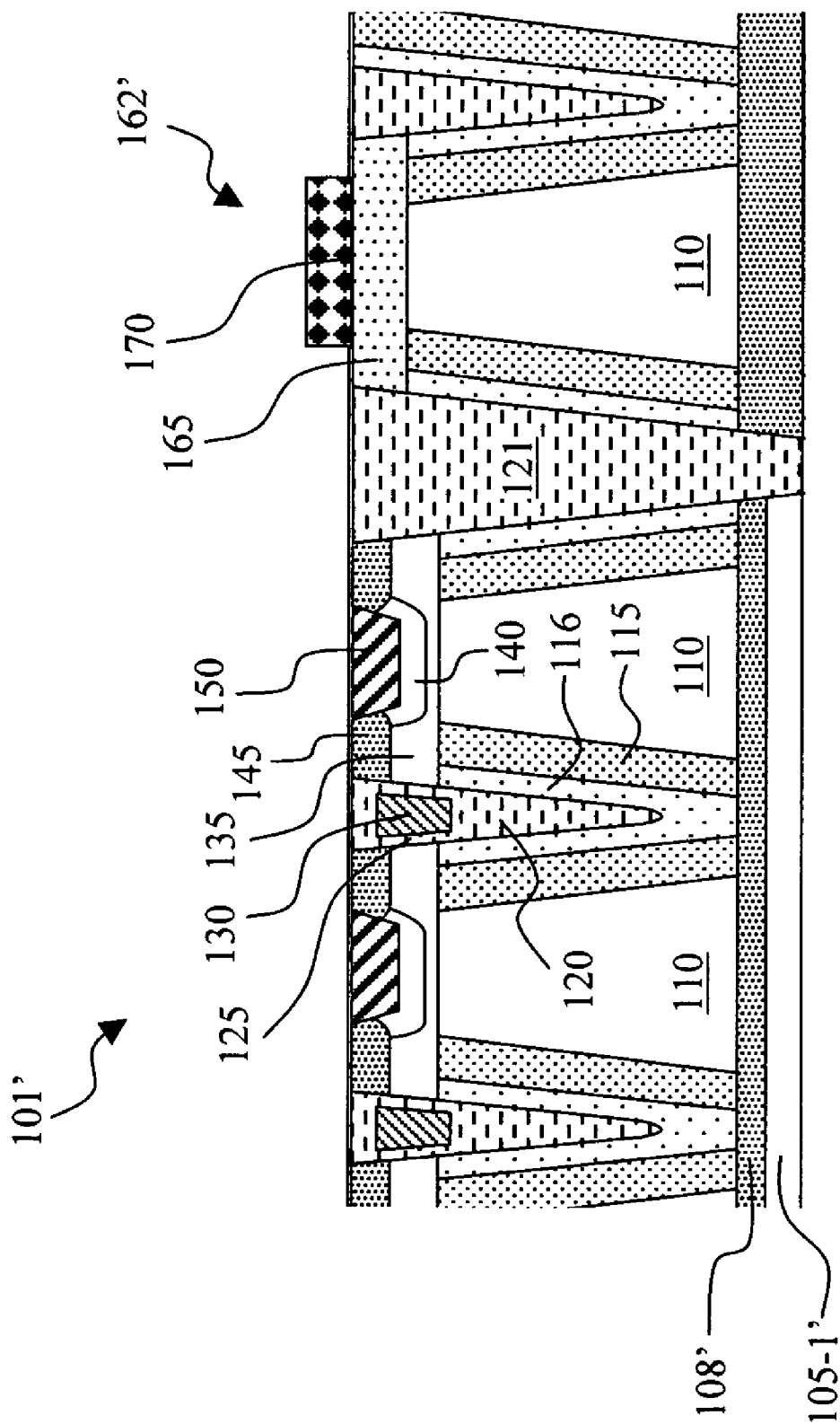
FIGS. 13A and 13B are cross sectional views of an IGBT device integrated with a Schottky device.
Figure 13B:
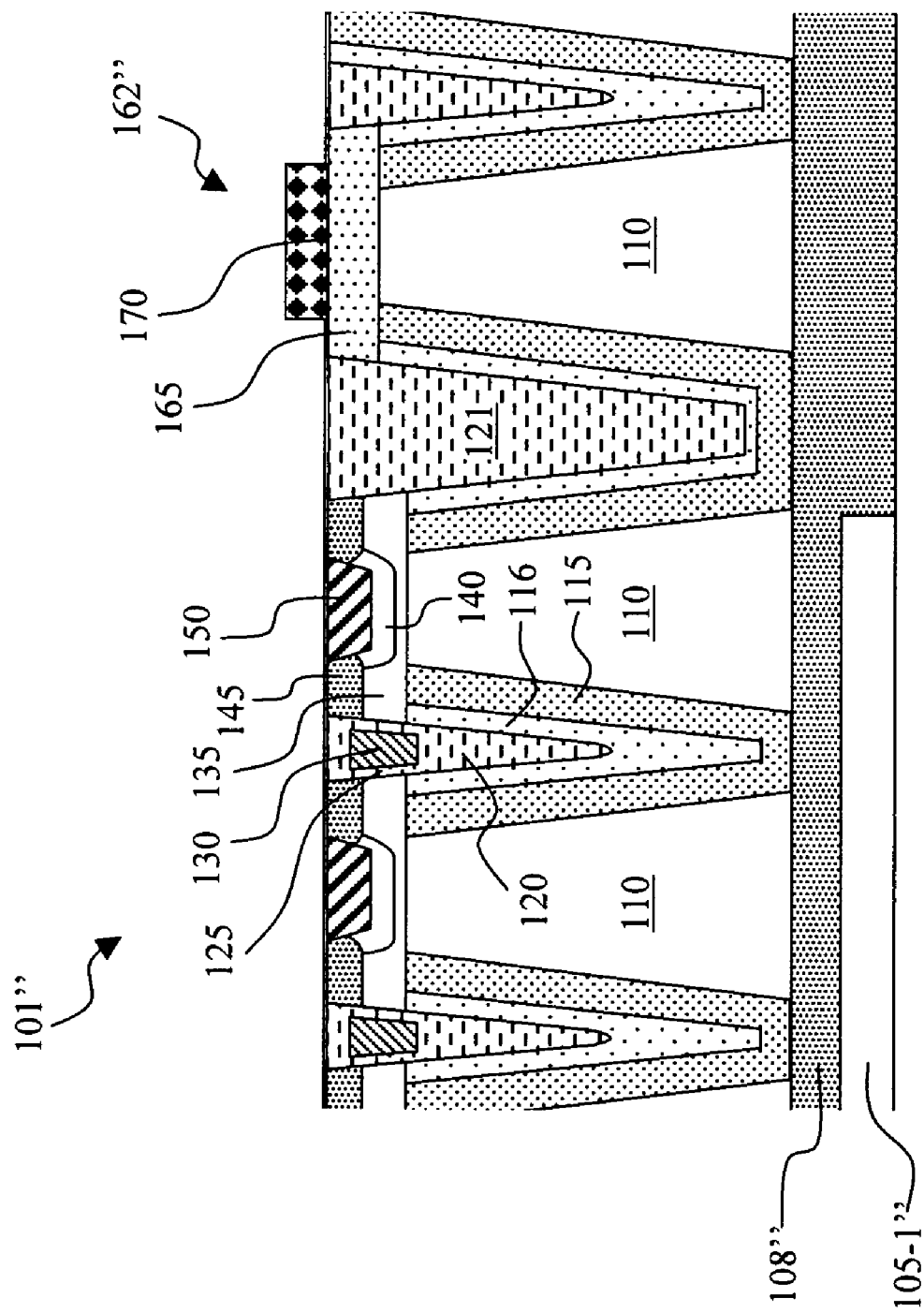

FIG. 13A is a cross sectional view of an IGBT device 101' similar to that of FIG. 3 integrated with a Schottky device 162' similar to that of FIG. 4. A wide trench with a deep and wide oxide fill 121 separates the devices. In this case, the semiconductor substrate has been backgrinded to the bottom of deep and wide oxide fill 121. N type layer 108' and P type layer 105-1' have been implanted into the bottom of the semiconductor material. This embodiment is useful since IGBTs do not have a built in diode like MOSFETs. It should be clear that the device may be formed from a single P− substrate, without an initial epitaxial layer, which can be backgrinded and implanted as described in U.S. application Ser. No. 12/484, 166. As shown in FIG. 13B, this structure can also be formed without the backgrinding so that a P type layer 105-1" is implanted into a portion of the N-type semiconductor substrate 108".

Although the present invention has been described in terms of the presently preferred embodiment, it is to be understood that such disclosure is not to be interpreted as limiting. For example, though the above describes an n-channel device, this invention can be applied to p-channel devices as well simply by reversing the conductivity types of the doped regions. Various devices may be formed including those with planar gates. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device comprising:
   a first semiconductor layer of a first conductivity type and a second semiconductor layer of a second conductivity type disposed above the first semiconductor layer;
   trenches opened in the second semiconductor layer extending vertically to the first semiconductor layer;
   a first epitaxial layer of a first conductivity type formed on sidewalls of the trenches;
   a second epitaxial layer formed on the first epitaxial layer;
   wherein the first epitaxial layer is substantially charge balanced with adjacent semiconductor regions; and
   a gate electrode disposed in an upper portion of at least some of the trenches and a deep dielectric layer under the gate electrode.

2. The semiconductor power device of claim 1 wherein:
   the second epitaxial layer substantially fills a lower portion of gaps not occupied by the first epitaxial layer in at least some of the trenches.

3. The semiconductor power device of claim 2 wherein:
   sidewalls of the second epitaxial layer merge together towards the bottom of the trench.

4. The semiconductor power device of claim 1 wherein:
the sidewalls of the trenches are angled to form tapered trenches converging toward a bottom surface of the trenches.

5. The semiconductor power device of claim 1 wherein:
the second epitaxial layer is of a first conductivity type.

6. The semiconductor power device of claim 1 wherein:
the second epitaxial layer is of a second conductivity type or an intrinsic semiconductor material.

7. The semiconductor power device of claim 1 further comprising:
a first dielectric fill in a central gap not occupied by the second epitaxial layer at the center of the trenches.

8. The semiconductor power device of claim 1 further comprising:
Schottky diodes and PN junction diodes formed between adjacent trenches.

9. The semiconductor power device of claim 8 wherein:
the PN junction diode is a charge injection controlled diode in series connection with a charge injection control resistor and in parallel connection with the Schottky diode.

10. The semiconductor power device of claim 1 wherein:
said second semiconductor layer has a width between two adjacent trenches significantly wider than a width of said first epitaxial layer.

11. The semiconductor power device of claim 1 wherein:
said second semiconductor layer having a width between two adjacent trenches at least about three times wider than a width of said first epitaxial layer.

12. The semiconductor power device of claim 1 wherein:
the semiconductor power device further comprises a MOSFET.

13. The semiconductor power device of claim 1 wherein:
the semiconductor power device further comprises an IGBT.

14. The semiconductor power device of claim 1 wherein:
the semiconductor power device further comprises an IGBT integrated with a diode.

15. The semiconductor power device of claim 7 further comprising:
a termination structure having a dielectric trench comprising a network of dielectric columns formed from said first dielectric fill and a second dielectric fill formed between said dielectric columns within the network.

16. The semiconductor power device of claim 7 wherein:
at least a second device is disposed on a semiconductor substrate wherein the trenches disposed between adjacent devices have a greater trench width.

17. The semiconductor power device of claim 1 wherein:
the device further comprises transistor cells arranged to have a stripe layout.

18. The semiconductor power device of claim 1 wherein:
the device further comprises transistor cells arranged to have a closed cell layout.

19. The semiconductor power device of claim 1 further comprising:
a termination region comprising an array of termination cells, with a first termination cell at an interface to the active area, wherein each termination cell further comprises:
a mesa of the second semiconductor layer having the first epitaxial layer formed on the sidewalls thereof and the second epitaxial layer formed on the first epitaxial layer, the mesa being adjacent to trenches with a dielectric fill;
a first region of the first conductivity type formed in the top surface of the mesa; and
a second region of the second conductivity type formed in the top surface of the mesa, the second region being spaced apart from the first region in the mesa,
wherein the first region of most termination cells is electrically connected to the second region of an adjacent termination cell.

20. A semiconductor power device comprising:
a first semiconductor layer of a first conductivity type and a second semiconductor layer of a second conductivity type disposed above the first semiconductor layer;
trenches opened in the second semiconductor layer extending vertically to the first semiconductor layer;
a first epitaxial layer of a first conductivity type formed on sidewalls of the trenches;
a second epitaxial layer formed on the first epitaxial layer;
wherein the first epitaxial layer is substantially charge balanced with adjacent semiconductor regions; and
said second semiconductor layer has a graded doping profile, with the doping concentration decreasing from top to bottom.

* * * * *